United States Patent
Bluem et al.

(10) Patent No.: US 6,214,460 B1
(45) Date of Patent: Apr. 10, 2001

(54) ADHESIVE COMPOSITIONS AND METHODS OF USE

(75) Inventors: Gregory L. Bluem, St. Paul; Christopher A. Haak, Oakdale; Fred B. McCormick, Jr., Maplewood; Stanley F. Tead, St. Paul, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/180,800

(22) PCT Filed: Nov. 12, 1996

(86) PCT No.: PCT/US96/18311

§ 371 Date: Nov. 16, 1998

§ 102(e) Date: Nov. 16, 1998

(87) PCT Pub. No.: WO97/43352

PCT Pub. Date: Nov. 20, 1997

Related U.S. Application Data

(63) Continuation-in-part of application No. 08/648,787, filed on May 16, 1996, now abandoned, which is a continuation-in-part of application No. 08/500,072, filed on Jul. 10, 1995, now abandoned.

(51) Int. Cl.[7] .................................................. B32B 7/12
(52) U.S. Cl. ............................ 428/355 AC; 428/355 EP
(58) Field of Search ........................ 428/355 AC, 355 EP

(56) References Cited

U.S. PATENT DOCUMENTS

| | | | |
|---|---|---|---|
| Re. 24,906 | 12/1960 | Ulrich | 206/59 |
| 3,475,213 | 10/1969 | Stow | 117/227 |
| 3,514,326 | 5/1970 | Stow | 117/227 |
| 3,691,140 | 9/1972 | Silver | 260/78.5 |
| 3,762,946 | 10/1973 | Stow et al. | 117/227 |
| 4,098,945 | 7/1978 | Oehmke | 428/327 |
| 4,113,981 | 9/1978 | Fujita et al. | 174/88 R |
| 4,122,143 | 10/1978 | Momotari et al. | 252/512 X |
| 4,127,699 | 11/1978 | Aumiller etal. | 428/461 |
| 4,166,152 | 8/1979 | Baker et al. | 428/522 |
| 4,181,752 | 1/1980 | Martens et al. | 427/54.1 |
| 4,243,455 | 1/1981 | Shiba et al. | 156/187 |
| 4,252,593 | 2/1981 | Green | 156/231 |
| 4,284,707 | 8/1981 | Nagasawa et al. | 430/196 |
| 4,303,485 | 12/1981 | Levens | 204/159.24 |
| 4,329,384 | 5/1982 | Vesley et al. | 428/40 |
| 4,330,590 | 5/1982 | Vesley | 428/336 |
| 4,379,201 | 4/1983 | Heilmann et al. | 428/345 |
| 4,387,115 | 6/1983 | Kitamura et al. | 252/512 X |
| 4,391,687 | 7/1983 | Vesley | 204/159.16 |
| 4,415,615 | 11/1983 | Esmay et al. | 428/40 |
| 4,425,263 | 1/1984 | Nazarenko | 252/511 |
| 4,495,318 | 1/1985 | Howard | 524/375 |
| 4,544,183 | 10/1985 | Parkinson | 427/54.1 X |
| 4,546,037 | 10/1985 | King | 428/323 |
| 4,548,862 | 10/1985 | Harman | 428/323 |
| 4,552,604 | 11/1985 | Green | 156/246 |
| 4,554,324 | 11/1985 | Husman et al. | 525/301 |
| 4,564,657 | 1/1986 | Nishikubo et al. | 525/158 |
| 4,568,592 | 2/1986 | Kawaguchi et al. | 428/107 |
| 4,587,152 | 5/1986 | Gleichenhagen | 428/195 |
| 4,587,313 | 5/1986 | Ohta et al. | 526/75 |
| 4,606,962 | 8/1986 | Reylek et al. | 428/148 |
| 4,612,209 | 9/1986 | Forgo et al. | 427/54.1 |
| 4,619,979 | 10/1986 | Kotnour et al. | 526/88 |
| 4,640,981 | 2/1987 | Dery et al. | 174/88 R |
| 4,659,788 | 4/1987 | Ohta et al. | 522/144 X |
| 4,659,872 | 4/1987 | Dery et al. | 174/117 A |
| 4,665,106 | 5/1987 | Ohta et al. | 522/49 |
| 4,680,226 | 7/1987 | Takeda | 428/327 |
| 4,695,608 | 9/1987 | Engler et al. | 525/308 |
| 4,701,279 | 10/1987 | Kawaguchi et al. | 252/511 |
| 4,729,809 | 3/1988 | Dery et al. | 156/306.6 |
| 4,731,282 | 3/1988 | Tsukagoshi et al. | 428/220 |
| 4,731,503 | 3/1988 | Kitanishi | 174/88 R |
| 4,737,559 | 4/1988 | Kellen et al. | 526/291 |
| 4,740,657 | 4/1988 | Tsukagoshi et al. | 174/88 R |
| 4,786,696 | 11/1988 | Bohnel | 526/88 |
| 4,814,040 | 3/1989 | Ozawa | 156/634 |
| 4,847,137 | 7/1989 | Kellen et al. | 427/54.1 X |
| 4,880,683 | 11/1989 | Stow | 428/200 |
| 4,931,347 | 6/1990 | Slovinsky et al. | 428/192 |
| 4,968,562 | 11/1990 | Delgado | 428/402 |
| 4,988,467 | 1/1991 | Holdsworth et al. | 264/46.6 |
| 4,994,322 | 2/1991 | Delgado | 428/343 |
| 5,001,542 | 3/1991 | Tsukagoshi et al. | 357/68 |
| 5,045,569 | 9/1991 | Delgado | 521/60 |
| 5,053,436 | 10/1991 | Delgado | 521/64 |
| 5,086,088 | 2/1992 | Kitano et al. | 522/170 |
| 5,087,494 | 2/1992 | Calhoun et al. | 428/40 |

(List continued on next page.)

FOREIGN PATENT DOCUMENTS

| | | |
|---|---|---|
| 0 143 530 | 6/1985 | (EP) . |
| 0 161 854 | 11/1985 | (EP) . |
| 0 210 309 | 2/1987 | (EP) . |

(List continued on next page.)

OTHER PUBLICATIONS

"Paint Flow and Pigment Dispersion", Temple C. Patton, pp. 355–361, 1979.

*Primary Examiner*—Blaine Copenheaver
*Assistant Examiner*—Christopher C. Pratt

(57) ABSTRACT

A screen-printable adhesive composition capable of being applied to a substrate at room temperature comprising at least one alkyl acrylate; at least one reinforcing comonomer, a polyepoxide resin, and a polyepoxide resin curing agent; wherein said composition is substantially solvent free and said composition has a yield point of greater than 3 Pascals and a viscosity of less than 6000 centipoise. In another aspect, the invention provides heat-curable electrically and/or thermally conductive adhesive films that are substantially solvent-free acrylic polymers further containing a polyepoxide resin, a polyepoxide resin curing agent, and an electrically conductive material and/or a thermally conductive material.

32 Claims, No Drawings

U.S. PATENT DOCUMENTS

| | | | |
|---|---|---|---|
| 5,118,750 | 6/1992 | Silver | 524/462 |
| 5,122,215 | 6/1992 | Shibata et al. | 156/250 |
| 5,141,989 | 8/1992 | Jung et al. | 524/561 |
| 5,143,785 | 9/1992 | Pujol et al. | 428/352 |
| 5,147,938 | 9/1992 | Kuller | 427/54.1 X |
| 5,155,301 | 10/1992 | Mase | 174/88 R |
| 5,194,455 | 3/1993 | Massow et al. | 522/152 |
| 5,196,246 | 3/1993 | Kauss etal. | 428/39 |
| 5,215,818 | 6/1993 | Silver et al. | 428/343 |
| 5,250,228 | 10/1993 | Baigrie et al. | 252/511 |
| 5,262,232 | 11/1993 | Wilfong et al. | 428/327 |
| 5,266,402 | 11/1993 | Delgado et al. | 428/355 |
| 5,275,856 | 1/1994 | Calhoun et al. | 428/40 |
| 5,310,840 | 5/1994 | Willett et al. | 526/273 |
| 5,330,684 | 7/1994 | Emori et al. | 252/512 |
| 5,362,421 | 11/1994 | Kropp et al. | 252/512 |
| 5,378,405 | 1/1995 | Gutman et al. | 252/62 |
| 5,457,149 | 10/1995 | Hall et al. | 25/523 |
| 5,506,279 | 4/1996 | Babu et al. | 522/34 |
| 5,508,313 | 4/1996 | Delgado et al. | 521/63 |
| 5,512,612 | 4/1996 | Brown et al. | 523/218 |
| 5,571,617 | 11/1996 | Cooprider et al. | 428/341 |
| 5,607,763 | 3/1997 | Matsuda | 428/323 |
| 5,626,955 | 5/1997 | Goetz et al. | 428/315.7 |

FOREIGN PATENT DOCUMENTS

| | | |
|---|---|---|
| 0 359 373 | 3/1990 | (EP) . |
| 0 386 909 | 9/1990 | (EP) . |
| 0 352 901 BA | 8/1995 | (EP) . |
| 0 365 479 B1 | 12/1995 | (EP) . |
| 2148199 | 3/1973 | (FR) . |
| 1395379 | 5/1975 | (GB) . |
| 57-10667 | 1/1982 | (JP) . |
| 59-134392 | 1/1986 | (JP) . |
| 1-315409 | 6/1988 | (JP) . |
| 5070605 | 3/1993 | (JP) . |
| 5212833 | 8/1993 | (JP) . |
| 5-310810 | 11/1993 | (JP) . |
| 5331427 | 12/1993 | (JP) . |
| WO 92/13924 | 8/1992 | (WO) . |
| WO 92/20073 | 11/1992 | (WO) . |
| WO 93/14171 | 7/1993 | (WO) . |
| WO 94/13750 | 6/1994 | (WO) . |
| WO 94/20586 | 9/1994 | (WO) . |
| WO 94/29368 | 12/1994 | (WO) . |
| WO 95/13331 | 5/1995 | (WO) . |
| WO 95/16998 | 6/1995 | (WO) . |
| WO 97.03143 | 1/1997 | (WO) . |

ADHESIVE COMPOSITIONS AND METHODS OF USE

This application is a 371(e) application of PCT/US96/18311 which is a continuation-in-part of U.S. Ser. No. 08/648,787, filed May 16, 1996, now abandoned, which is a continuation-in-part of U.S. Ser. No. 08/500,072, filed Jul. 10, 1995, now abandoned.

FIELD OF THE INVENTION

The present invention relates to screen-printable adhesives and heat-curable adhesive films.

BACKGROUND OF THE INVENTION

Screen printing of adhesives is known in the art and is used advantageously to apply adhesives to selected areas on a substrate. The adhesive printed or coated areas can subsequently be used to adhere to a second substrate. Typical screen-printable adhesives are pressure-sensitive adhesives which are tacky at room temperature, or heat-activatable adhesives, which are not tacky at room temperature, but become tacky when heated. Examples of screen-printable adhesives include (meth)acrylic polymers and copolymers dispersed in an organic solvent or water.

Acrylic adhesives, both pressure-sensitive and heat-activatable types, are widely used in industry because they are stable over time, and they can be formulated to adhere to a wide variety of different surfaces. Typical acrylic adhesives are prepared as taught in U.S. Pat. No. 24,906 RE (Ulrich). With the advent of more stringent environmental controls, the technology in adhesives in general has evolved from solvent-based materials to water-based materials, and to a degree, solvent-free materials. Solvent-free acrylate adhesives are known and fall in various categories of processing such as heat-activatable coating and radiation curing which includes E-beam curing, ultraviolet light processing, and gamma radiation processing. Solvent-free crosslinked compositions are known in the art, but they would provide little utility for adhesively bonding to other substrates since they are highly crosslinked and do not flow or become tacky on heating.

Ultraviolet light processed adhesives are described in U.S. Pat. No. 4,181,752 (Martens et al.). While known adhesives processed by ultraviolet light have their own utility and advantages, they do not screen print well because they tend to become stringy during screen printing. Thus, an ongoing need exists for pressure-sensitive and heat-activatable screen printable adhesives that are solvent-free, can be screen printed without the use of a solvent, and provide good shear strength and peel strength.

An adhesive that has the ability to establish multiple discreet electrical connections, often in extremely close proximity, between two substrates is known as an "anisotropically conductive adhesive." Typically, these adhesives are in the form of transfer tapes or free standing films where an insulating adhesive matrix contains sufficient conductive particles to allow electrical conduction through the thickness of the film (the z-axis) while providing no conductivity in the plane of the film. Such film types are known as "z-axis adhesive films" or "ZAF." A typical use for this adhesive is to provide connection between a flexible printed circuit and a rigid circuit such as a flat panel display or epoxy-glass laminate printed circuit board.

Several ZAF materials are described in the literature. Some of these ZAF materials use non-reactive hot-melt type adhesive compositions such as styrene/butadiene/styrene block copolymers. They provide a long shelf life and short bond times at low temperatures. However, they show poor resistance to elevated temperature and humidity aging. Other ZAF materials use thermoset resins that crosslink, usually with the aid of curatives or catalysts, at the bonding temperatures. However, these ZAF materials typically require high bond temperatures, such as 170° C. or higher, and are difficult to use on temperature sensitive substrates.

Additionally, known ZAF materials are manufactured using solvent casting. Solvents usually must be captured or destroyed, and solvents can lead to damage of substrates and components. Additionally, the use of catalysts which are effective at lower temperatures typically leads to reduced shelf life of the ZAF. The use of photoactivated curatives in ZAF materials is also known. However, these adhesives need to be protected from light to avoid premature photoactivation. The methods of the present invention utilize heat curable adhesive films that are capable of rapidly bonding at low temperature, have a long shelf-life at ambient temperature, and provide stable electrical/and or thermal connections over a prolonged period of time.

SUMMARY OF THE INVENTION

The present invention provides a screen-printable adhesive composition capable of being applied to a substrate at room temperature comprising the following components:

(a) 25 to 100 parts by weight of at least one alkyl acrylate monomer;

(b) 0 to 75 parts by weight of at least one reinforcing comonomer;

(c) from 25 to 150 parts polyepoxide resin per 100 parts acrylate monomers; and (d) an effective amount of a heat-activatable polyepoxide resin curing agent, wherein said composition and components are substantially solvent free and said composition has a yield point of greater than 3 Pascals and a viscosity of less than 6000 centipoise at 25° C.

In another aspect, the present invention provides a screen-printable adhesive composition capable of being applied to a substrate at room temperature comprising the following components:

(a) 25 to 100 parts by weight of at least one alkyl acrylate monomer;

(b) 0 to 75 parts by weight of at least one reinforcing comonomer; and (c) an effective amount of a core-shell polymer or a semi-crystalline polymer to provide a screen-printable composition, wherein said composition and components are substantially solvent free and said composition has a yield point of greater than 3 Pascals and a viscosity of less than 6000 centipoise at 25° C.

In another aspect, the present invention provides a method of providing an electrical interconnection comprising the steps of:

a) applying a heat-curable electrically conductive adhesive film to an electrically conductive substrate, said adhesive film comprising an acrylate polymer, a polyepoxide resin, an effective amount of a heat-activatable modified aliphatic amine polyepoxide resin curing agent, and an effective amount of an electrically conductive material, said acrylate polymer comprising the polymerization reaction product of:

(i) an acrylate monomer; and
(ii) a crosslinking agent having an acrylate moiety,
wherein said composition and components (i) and (ii) are substantially solvent free; and b) curing said polyepoxide resin in said adhesive film by heating said adhesive film to a temperature of between 90 to 180° C. for from 15 seconds to 5 minutes.

In another aspect, the present invention provides a method of providing heat transfer comprising the steps of:

a) applying a heat-curable thermally conductive adhesive film to a substrate, said adhesive film comprising an acrylate polymer, a polyepoxide resin, an effective amount of a modified aliphatic amine polyepoxide resin curing agent, and an effective amount of a thermally conductive material, said acrylate polymer comprising the polymerization reaction product of:
(i) an acrylate monomer; and
(ii) a crosslinking agent having an acrylate moiety,
wherein said composition and components (i) and (ii) are substantially solvent free; and b) curing said polyepoxide resin in said adhesive film by heating said adhesive film to a temperature of between 90 to 180° C. for from 15 seconds to 5 minutes.

The present invention also provides tapes using the above adhesive compositions.

Additional features and advantages of the invention will be set forth in the description which follows, and in part will be apparent from the description, or may be learned by practice of the invention. The objectives and other advantages of the invention will be realized and attained by the methods and articles particularly pointed out in the written description and claims hereof.

It is to be understood that both the foregoing general description and the following detailed description are exemplary and explanatory and are intended to provide further explanation of the invention as claimed.

DETAILED DESCRIPTION OF THE INVENTION

The present invention relates to screen printable adhesive compositions and heat curable electrically and/or thermally conductive adhesive films.

The screen-printable pressure bondable adhesives of the invention are substantially solvent-free acrylic polymers that can be screen printed without requiring the use of additional solvent. As used herein, "pressure bondable" refers to adhesives that are applied to one surface, and will bond to a second surface under pressure. The screen-printable adhesives include pressure-sensitive adhesives which are tacky at room temperature, and heat-activatable adhesives which are substantially non-tacky at room temperature, but will bond at an elevated temperature which is typically in the range of from about 25° C. to 200° C.

The heat-curable electrically and/or thermally conductive adhesive films of the invention are substantially solvent-free acrylic polymers further containing a polyepoxide resin, a polyepoxide resin curing agent, and an electrically conductive material and/or a thermally conductive material. These heat-curable adhesive films are also pressure bondable as described above.

As used herein, the term "polyepoxide" means a molecule that contains more than one

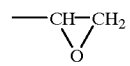

group.

As used herein, "substantially solvent free" refers to an adhesive that has been prepared without the use of large amounts of solvent, that is, less than 5 percent by weight of a coating composition, preferably less than about 2 percent, and more preferably no additional solvent is added. The preparation of the screen-printable adhesives and the film adhesives includes processes used in the polymerization of the monomers present in the adhesive as well as processes used in coating the adhesive to make finished articles, for example, pressure-sensitive adhesive tapes. The term "solvent" refers to conventional organic solvents used in the industry which include, for example, toluene, heptane, ethyl acetate, methyl ethyl ketone, acetone, and mixtures thereof.

The screen-printable adhesives of the invention are prepared from adhesive compositions comprising from about 25 to 100 parts by weight of at least one alkyl acrylate monomer, and correspondingly, from about 75 to 0 parts by weight of a reinforcing comonomer.

Alkyl acrylate monomers useful in the practice of the screen-printable invention are those which have a homopolymer glass transition temperature less than about 0° C. Useful alkyl acrylates are unsaturated monofunctional (meth)acrylic acid esters of non-tertiary alkyl alcohols having from 2 to 20 carbon atoms in the alkyl moiety, and preferably from 4 to 18 carbon atoms. Examples of useful alkyl acrylate monomers include, but are not limited to, n-butyl acrylate, hexyl acrylate, octyl acrylate, isooctyl acrylate, 2-ethylhexyl acrylate, isononyl acrylate, decyl acrylate, lauryl acrylate, octadecyl acrylate, and mixtures thereof. A useful aromatic acrylate is phenoxy ethyl acrylate.

A monoethylenically unsaturated reinforcing comonomer having a homopolymer glass transition temperature greater than about 25° C. is preferably copolymerized with the acrylate monomers in the screen-printable adhesives of the invention. Examples of useful copolymerizable monomers include, but are not limited to, (meth)acrylic acid, N-vinyl pyrrolidone, N-vinyl caprolactam, substituted (meth) acrylamides, such as N,N,-dimethyl acrylamides, acrylonitrile, isobornyl acrylate, N-vinyl formamide, and mixtures thereof. When a copolymerizable monomer is used, the alkyl acrylate is present in the screen-printable composition in amounts from about 25 to 99 parts by weight and the copolymerizable monomer is present in corresponding amounts from 75 to 1 parts by weight wherein the total amount by weight is 100.

The amounts and types of comonomer can be varied to provide pressure-sensitive or heat-activatable properties as desired for the end use. Larger amounts of comonomer will result in less tack and are suitable as heat-activatable adhesives while lower amounts are more suitable for pressure-sensitive adhesives. The type of comonomer can also be varied to obtain desired properties. Polar comonomers, that is, those which have hydrogen-bonding moieties, such as acrylic acid are useful in amounts from about 1 to about 15 parts by weight for pressure-sensitive screen-printable adhesives. Amounts above about 15 parts are useful as heat-activatable screen-printable adhesives. Less polar comonomers such as N-vinyl caprolactam, N-vinyl pyrrolidone, and isobornyl acrylate provide pressure-sensitive properties to a screen-printable adhesive up to about 40 parts by weight, while amounts above about 40 parts will provide heat-activatable screen-printable adhesives.

The screen-printable adhesive compositions of the invention are prepared so that they have a yield point and viscosity suitable for screen printing. The yield point is the stress needed to cause the adhesive to flow. Since the compositions would be screen printed on relatively large surface areas, they should flow sufficiently to provide a fairly smooth surface in a short amount of time, that is, within minutes after screen printing. Compositions are selected to provide a yield point that is high enough to maintain printing resolution after printing onto a substrate.

The compositions of the invention generally have a calculated yield point of greater than 3 Pascals and preferably have a calculated yield point of greater than 5 Pascals as determined by the Casson Model. The Casson Model is described in more detail in *Paint Flow and Pigment Dispersion*, by Temple C. Patton, Second Edition, 1979, pages 355–361, incorporated by reference herein. If the adhesive composition is filled with particles, the yield point is typically greater than about 10 Pascals to help keep the particles in suspension.

The shear rate was measured as a function of applied shear stress using a Carri-Med CS Rheometer. The measured values were used in the Casson Model to calculate viscosity at infinite shear. The calculated viscosities of the screen-printable compositions should be low enough for screen printing, but high enough to prevent excessive flow and maintain definition. Preferably, the viscosity of the adhesives is less than about 6000 centipoise (cps) at 25° C., and more preferably, less than about 5000 centipoise, and most preferably less than about 1500 centipoise. Typically, the viscosity is greater than 50 cps, but there is not a specific lower limit if the composition thickens or coalesces upon removal of the screen. Compositions containing particles preferably have a viscosity greater than about 100 cps.

Some adhesive compositions, especially pressure-sensitive adhesive compositions, are prone to stringing which makes them undesirable for screen printing. Stringing can be reduced or eliminated by controlling the molecular weights of the polymers and prepolymers in the compositions.

Stringing can also be reduced in a partially polymerized syrup by adding a chain transfer agent to the monomers before polymerizing to control the molecular weight.

The chain transfer agents useful in the practice of the invention include, but are not limited to, carbon tetrabromide, n-dodecyl mercaptan, isooctyl thiolglycolate, and mixtures thereof. The chain transfer agent(s) are present in amounts from about 0.01 to about 1 part by weight per 100 parts of acrylate (pph), that is, 100 parts of the alkyl acrylate and the reinforcing comonomer, and preferably in amounts from about 0.02 to 0.5 pph.

The weight average molecular weight of the polymers of the useful adhesive compositions, that is, syrup, is between about 50,000 and 1,000,000. Preferably the molecular weight is between about 100,000 and about 800,000, and most preferably, between about 150,000 about 600,000. The lower molecular weights limit the elongational viscosity and result in less stringing of the adhesive during screen printing.

Fillers useful for the invention include fumed silica which will thicken a monomer mixture of the monomers described above or a syrup of the monomers. The silica imparts thixotropy to the mixture which will allow it to thicken after the stress of screen printing is removed.

Solutions with a useful viscosity which do not exhibit stringing can also be obtained by adding a thermoplastic polymer or copolymer of appropriate molecular weight, or macromer to the monomer mixture or syrup of the above described acrylates. Preferably, the polymer, copolymer, or macromer has a weight average molecular weight of less than about 100,000. Useful thermoplastic polymers include acrylic polymers such as poly(iso-butylmethacrylate) such as ELVACITE™ 2045 (ICI Americas). Useful copolymers include block copolymers such as styrene butadiene copolymers and acrylic copolymers. Useful macromers are those which are copolymerizable with the acrylate monomers and are described in U.S. Pat. No. 4,554,324 (Husman et al.), incorporated herein by reference, and are commercially available from ICI Americas (ELVACITE™ 1010).

Other useful thermoplastic polymers or copolymers include semi-crystalline polymers that sufficiently thicken and build a yield stress in the adhesive composition to prevent the adhesive composition from flowing after screen printing the adhesive composition. The useful semi-crystalline polymers are also soluble in the acrylate monomers at a temperature of about 80° C. and form a clear solution. Examples of useful semi-crystalline polymers include ethylene/ethyl acrylate/glycidyl methacrylate terpolymers available from Elf Atochem North America, Philadelphia, Pa., and ethylene/butyl acrylate/glycidyl methacrylate terpolymers, available from Quantum Chemicals, Cincinnati, Ohio, under the trademark ENATHENE™, and ethylene/ethyl acrylate/carbon monoxide terpolymers available from DuPont Company, Wilmington, Del. Preferably, the semi-crystalline polymers comprise greater than 20 weight percent non-ethylene comonomers and preferably have a melt index in the range of about 75 g/min at 190° C. (ASTM D1238).

In the practice of the invention, the polymer, copolymer, semi-crystalline polymer, or macromer is dissolved in the acrylate monomers or syrup. This can be done on conventional equipment such as roller mill, ball mill, and the like. The monomers or syrups can be heated, for example, to about 80° C. to enhance dissolution of the polymers or macromers. Screen-printable adhesive compositions of the present invention that use semi-crystalline polymers do not require additional thixotropic agents to obtain a desired yield point as the semi-crystalline polymers separate into crystalline and non-crystalline domains and provide a thixotropic adhesive composition suitable for screen printing.

The semi-crystalline polymers are used in the screen-printable adhesive composition in amounts of about 3 to 20 weight percent and preferably, 5 to 15 weight percent.

Another embodiment of the screen-printable adhesive compositions of the present invention contains a polyepoxide resin or a mixture of polyepoxide resins. The polyepoxide resin can be added to either the monomer mixture or to the syrup of the above described acrylates to modify the viscosity of and to control stringing of the adhesive composition. Useful polyepoxide resins include those selected from the group of compounds that contain an average of more than one, and preferably at least two epoxide groups per molecule. The polyepoxide resins can be either solid, semi-solid, or liquid at room temperature. Combinations of different types of polyepoxide resins can be used to obtain the desired viscosity.

Representative polyepoxide resins include, but are not limited to, phenolic polyepoxide resins, bisphenol polyepoxide resins, hydrogenated polyepoxide resins, aliphatic polyepoxide resins, halogenated bisphenol polyepoxide resins, novolac polyepoxide resins, and mixtures thereof. Preferred polyepoxide resins include diglycidyl ethers of bisphenol A. Examples of useful commercially available polyepoxide resins include those having the trade designation EPON™ 164, EPON™ 825, EPON™ 828, and EPON™ 1002, all available from Shell Chemical Co., Houston, Tex. The preferred polyepoxide resins have a molecular weight in the range of from about 300 to 2000.

The polyepoxide resin is used in the compositions of the invention in an effective amount to provide a screen-printable viscosity (at room temperature) with little or no stringing of the composition. The polyepoxide resin can be used in the screen-printable adhesive compositions of the present invention in amounts of about 25 parts polyepoxide resin to about 150 parts polyepoxide resin per 100 parts of acrylate monomers. Preferably, the amount of polyepoxide resins used is from about 60 to about 120 parts per 100 pats acrylate monomers and more preferably, is from about 65 to about 110 parts polyepoxide resin per 100 parts acrylate monomers.

In practice, the polyepoxide resins are mixed in the acrylate monomers or the acrylate syrup using conventional mixing techniques, for example, gentle rolling, and roller and ball milling, and the like. The acrylate monomers or syrups can also be heated up to about 80° C. to enhance mixing of the polyepoxide resins.

The polyepoxide resins are cured with any type of polyepoxide curing agent and preferably are cured with a heat-activatable curing agent. The useful polyepoxide curing agents can be either acid or base curing agents. Preferably, the polyepoxide curing agent used is a base curative and is insoluble in the polyepoxide resins at a temperature of about 20° C. and is soluble in the polyepoxide resins upon heating the polyepoxide resins to above a temperature of about 60° C. and cure the polyepoxide resins at an elevated temperature, for example, greater than 160° C. "Insoluble" means that there is no substantial curing of the polyepoxide over a prolonged period of time at room temperature. Examples of useful curing agents that cure polyepoxide resins at elevated temperatures include dicyandiamide in combination with an accelerator described below.

In cases where the oven curing temperatures may be insufficient to fully cure the polyepoxide resins when using the above curing agents, it is useful to include an accelerator in the screen-printable adhesive composition before screen printing the adhesive so that the resin can fully cure at a lower temperature, or cure within a shorter period of time. Imidizoles and urea derivatives are particularly preferred as accelerators because their presence often does not reduce the shelf life of the screen-printable adhesive compositions of the invention. Examples of useful imidazoles include 2,4-diamino-6-(2'-methyl-imidazoyl)-ethyl-s-triazine isocyanurate, 2-phenyl-4-benzyl-5-hydroxymethylimidazole, 2,4-diamino-6(2'-methyl-imidazoyl)-ethyl-s-triazine, hexakis (imidazole)nickel phthalate, and toluene bisdimethylurea. An accelerator may be used in adhesive compositions of the present invention in amounts up to about 20 parts by weight per 100 parts by weight of the acrylate monomers.

For adhesive compositions of the present invention that are screen printed onto polymeric substrates, particularly thin polymeric substrates that may deformed from exposure to high temperature or prolonged exposure to moderately high temperatures, the preferred polyepoxide curing agents are those that induce curing of the polyepoxide resin quickly and/or cure the polyepoxide resins under relatively low temperatures. Such curing agents include the modified amines. Examples of modified amines include adducts of an amine with epoxy resins, alkylene epoxides or acrylonitrile and condensation reaction products of an amine with fatty acids or mannich bases. Generally, such modified amine curing agents cure the polyepoxide resin when the composition is exposed to a temperature of between 90 to 180° C. and have a cure time of from 15 seconds to 5 minutes. Preferably, the polyepoxide resin is cured at a temperature of between 110 and 160° C. and a cure time of from 15 seconds to up to 3 minutes. More preferably, the polyepoxide resin is cured in from 15 to 90 seconds at a curing temperature of from 120 to 150° C. A preferred modified amine polyepoxide curing agent is a reaction product of a novolac polyepoxide resin and a di-primary aliphatic amine. Examples of such modified amine curing agents include those commercially available from Air Products and Chemicals, Inc. under the ANCAMINE™ trademark such as ANCAMINE™ 2337S and 2014 curing agent, and AJI-CURE™ PN23 and MY23, available from Ajinimoto, Japan.

In practice, the polyepoxide resin curing agents are dispersed in the polyepoxide resin/acrylate monomers or syrups compositions under conventional gentle mixing, for example using a paddle mixer, and the like. Preferably, the curing agent is dispersed in the epoxide containing component(s) or the adhesive composition.

Preferably, the polyepoxide curing agent is included in the adhesive composition in an amount sufficient to affect the curing of the polyepoxide resin under heat. Typically, the heat-activatable polyepoxide curing agent is used in an amount of about 0.1 to about 20 parts by weight, and preferably is used in an amount of from about 0.5 to about 10 parts by weight per 100 parts by weight of the total adhesive composition.

Another embodiment of the screen-printable adhesive compositions of the invention contains crosslinked polymeric particles that are swellable in the acrylate monomers and are known as "core-shell" polymers. Core-shell polymers are polymeric particles which have elastomeric or rubbery cores that are substantially surrounded by a shell material that is typically a thermoplastic polymer. The cores are formed from polymerized diene or acrylic rubbers while the shell materials are usually polyacrylate or polymethacrylate polymers. Preferred core-shell polymers are those which can be completely dispersed in the acrylate monomers, that is, provide a visually smooth dispersion as measured for example, by a Hegman gauge.

Preferred core-shell polymers have a particle size of less than 5 microns, and more preferably, have a particle size of less than 1 micron. Generally, the core-shell particles are added to the acrylate monomers in an amount to provide a viscosity and yield stress suitable for screen printing. If too high an amount of core-shell polymers is added to the composition, the polymers will not adequately disperse. If too little of an amount is added to the composition, the composition will not have the required yield stress for screen printing. Examples of commercially available core-shell polymers include KANE ACE™ M901, from Kaneka Co., Japan, and PARALOID™ EXL-2691 and -2691A, from Rohm & Haas, Philadelphia, Pa.

The core-shell polymers are present in the screen-printable compositions in a range of from 5 to 25 percent by weight and are preferably present in amounts of from 10 to 20 weight percent of the screen-printable compositions.

In practice, the core-shell polymers are added to the acrylate monomers and dispersed wherein the particles are swelled by the acrylate monomers and form thixotropic compositions having suitable viscosities for screen printing.

In a preferred embodiment, the adhesive composition also includes a thixotropic agent, if required, such as silica to impart thixotropy to the composition. The viscosity of a thixotropic composition decreases when it is subjected to shear stresses so that it flows when it is screen printed. Once the shear stress is removed, the thixotropic material increases rapidly in viscosity so that the printed adhesive essentially does not flow once it has been printed onto a substrate. A suitable silica is commercially available under the CAB-O-SIL™ trade name (such as M-5 and TS-720) from Cabot Corporation and AEROSIL™ 972 Silica from DeGussa Corporation.

In another preferred embodiment, the screen-printable adhesive composition also includes electrically conductive materials. Such materials include, but are not limited to, metal particles and spheres such as aluminum, nickel, gold, copper, or silver, and coated copper, nickel, polymeric and glass spheres and particles coated with conductive coatings such as aluminum, gold, silver, copper, or nickel. Also useful are solder particles such as lead/tin alloys in varying amounts of each metal (available from Sherritt Gordon Limited, Canada). Examples of commercially available electrically conductive particles include conductive nickel spheres from Novamet, Inc., Wykoff, N.J. Electrically conductive materials are also available from Japan Chemicals, Inc., Japan; Potters Industries Inc., Parsippany, N.Y.; and Sherritt Gordon Limited, Canada.

The amount of electrically conductive materials used in the screen-printable adhesive compositions of the invention depends upon the type of substrate to be bonded and its end use. For example, for interconnecting a flexible circuit to a circuit board or to a liquid crystal display (LCD) where anisotropic or "z" axis electrical conductivity is required, the screen-printable adhesive composition contains from 1 to 20, and preferably, from 1 to 10 percent of electrically conductive materials by volume of the composition. In bonding for shielding or grounding applications, for example, grounding a printed circuit board to a heat sink, or for electromagnetic interference (EMI) shielding, the screen-printable adhesive composition contains from 1 to 80, and preferably, from 1 to 70 percent electrically conductive material by volume of the adhesive composition.

The screen-printable compositions of the invention also preferably include free radical initiators. The initiators are known in the art and are preferably light activated. In a preferred embodiment, the initiator is a photoinitiator and examples include, but are not limited to, substituted acetophenones, such as 2,2-dimethoxy-2-2-phenylacetophenone, benzoin ethers such as benzoin methyl ether, substituted benzoin ethers such as anisoin methyl ether, substituted alpha-ketols such as 2-methyl-2-hydroxypropiophenone, phosphine oxides, and polymeric photoinitiators. Photoinitators are commercially available from sources such as Ciba Geigy Corp. under the IRGACURE™ trade designation, such as IRGACURE™ 184, IRGACURE™ 651, IRGACURE™ 369, IRGACURE™ 907, under the ESCACURE™ trade name from Sartomer, and under the LUCIRIN™ TPO trade name from BASF.

The photoinitiators can be used in amounts from about 0.001 pph to about 5 pph depending upon the type and molecular weight of the photoinitiator. Generally, lower molecular weight materials are used in amounts of about 0.001 pph to about 2 pph, while higher molecular weight polymeric photoinitiators are used in amounts from about 0.1 pph to about 5 pph.

Crosslinking agents can be added to the screen-printable adhesive compositions to improve the cohesive strength of the adhesive.

Useful crosslinking agents include multifunctional acrylates, such as those disclosed in U.S. Pat. No. 4,379,201 (Heilman), which include but are not limited to 1,6-hexanediol diacrylate, trimethylolpropane triacrylate, 1,2-ethylene glycol diacrylate, pentaerythritol tetracrylate, and mixtures thereof, copolymerizable aromatic ketone comonomers such as those disclosed in U.S. Pat. No. 4,737,559 (Kellen), photoactive triazines such as those disclosed in U.S. Pat. Nos. 4,329,384 (Vesley et al.), 4,330,590 (Vesley), and 4,391,687 (Vesley), organosilanes, benzophenones, and isocyanates. Thermally activated organic peroxides, such as di-t-butyl peroxides, can also be used for crosslinking by heat. Other useful crosslinking agents include urethane and epoxy diacrylate oligomers available under trademarks EBECRYL™ 230, EBECRYL™ 3605, and EBECRYL™ 8804 from UCB Radcure Inc., Smyrna, Ga., and CN 104™ from Sartomer Co., Exton, Pa.

The crosslinking agents are included in amounts from about 0.002 pph (parts per 100 parts of acrylate monomers, that is, the alkyl acrylate and the optional comonomer) to about 2 pph, and preferably from about 0.01 pph to about 0.5 pph. The amount used will depend upon the amount of functionality and molecular weight of the crosslinking agent, and the desired properties of the adhesive. For electrically conductive screen-printable adhesives, it is preferred that the amounts of crosslinking agents and the chain transfer agents are limited so that the adhesive flows sufficiently during bonding so that the conductive particles can come into contact with each other or with the conductive portion of the substrates to provide conductive pathways. Preferred heat activated electrically conductive screen-printable adhesives have a tan delta of greater than 1 at 140° C. and above, measured at 1 radian/sec. At these temperatures the adhesives have flow properties similar to a viscous liquid.

Tackifying agents can also be added to the syrups of the screen-printable compositions to enhance adhesion to certain low energy surfaces such as those on olefinic substrates. Useful tackifying agents include hydrogenated hydrocarbon resins, phenol modified terpenes, poly(t-butyl styrene), rosin esters, vinyl cyclohexane, and the like. Suitable tackifying resins are commercially available and include, for example, those sold under the REGALREZ™ and FORAL™ trade designations from Hercules, such as REGALREZ™ 1085, REGALREZ™ 1094, REGALREZ™ 6108, REGALREZ™ 3102, and FORAL™ 85.

When used, tackifying agents can be used in amounts from about 1 to about 100 pph, preferably 2 to 60 pph, and more preferably, 3 to 50 pph.

Other adjuvants can be included in the screen-printable compositions either before or after making the syrup in amounts needed to effect the desired properties as long as they do not affect the polymerization and the desired end properties. Useful adjuvants include dyes, pigments, fillers, coupling agents, and thermally conductive materials.

The screen-printable adhesives are useful in the preparation of pressure-sensitive adhesive coated articles, such as tapes and sheets. Tapes typically have narrow widths in comparison to length. Sheets typically have substantially equal lengths and widths and may generally be prepared in the same manner as tapes. The tapes can be prepared as transfer tapes in which the screen printable adhesive is typically provided on a liner coated on both sides with a release coating. The tapes can also be prepared by having the adhesive permanently adhered to the backing. Tapes with the adhesive permanently adhered to the backing can be prepared either by laminating the adhesive of a transfer tape to the backing, or by coating the composition onto the backing and curing the adhesive on the backing. Tapes can also be double coated tapes wherein both sides of the backing have a layer of adhesive on them. Useful backing materials include polymeric films, such as those made from cast and oriented polyesters, cast and oriented polypropylene, polyethylene, paper, metal foils, woven and nonwoven fabrics, and foams, such as those made from polyolefins and acrylics. Examples of suitable acrylic foams are those disclosed in U.S. Pat. No. 4,415,615 (Esmay et al.). Suitable polyolefin foams include crosslinked polyethylene and polyethylene/EVA foams.

The screen-printable adhesives of the present invention are particularly useful for screen printing directly onto a substrate when it is desired to have adhesive only on select areas of the surface. One such substrate is a flexible electrical circuit. Flexible electrical circuits generally comprise a polymeric film coated with electrically conductive metals such as copper, which has been etched to provide electrically conductive circuit traces. The polymeric films are typically polyimide, although other types of films such as polyester are also used. Suitable flexible circuits are commercially available from such sources as Minnesota Mining and Manufacturing Company, St. Paul, Minn. and Nippon Graphite, Ltd. Flexible circuits are also described in U.S. Pat. Nos. 4,640,981, 4,659,872, 4,243,455, and 5,122,215. For these types of applications, preferred screen-printable compositions for the adhesives comprise from about 25 to 99 parts alkyl acrylate monomers and 75 to 1 parts of at least one reinforcing monomer that does not contain acid, and 1 percent to 10 percent by volume of electrically conductive particles. Preferably, the comonomer is isobornyl acrylate and the electrically conductive particles are present in amounts of about 1 percent to 5 percent by volume.

Flexible electrical circuits are used in electronic devices where an electrical interconnection must be made, such as between two circuit boards, or between a circuit board and a liquid crystal display (LCD). Such connectors are useful in a variety of electronics such as in calculators, computers, pagers, cellular phones, and the like.

The screen-printable adhesives are also useful as a damping polymer. The polymer may be used as a free layer damper in which the adhesive is used by itself, or as a constrained layer damper. In the constrained layer damper, the adhesive is bonded to a material having a higher modulus than the adhesive. Examples of useful constraining layers include, but are not limited to, metals such as aluminum, stainless steel, cold rolled steel, and the like. In practice, the adhesives of the invention can be screen printed directly onto the constraining layer. When the adhesive material is not pressure-sensitive, the adhesive can be bonded to the constraining layer by heating to, for example, 70° C., and applying pressure on the adhesive.

In a method of practicing the invention, a syrup is formed by partially polymerizing a mixture of the alkyl acrylate, the optional comonomer, a free radical initiator, and a chain transfer agent. Useful free radical initiators for making the syrup include the above-described photoinitiators as well as thermal initiators. Suitable thermally activated free radical initiators are commercially available such as those available from DuPont Company under the VAZO trade designation. Specific examples include VAZO™ 64 (2,2'-azobis (isobutryoniltrile) and VAZO™ 52. Useful amounts can vary from about 0.01 pph to about 2 pph. Preferably, the partial polymerization is effected by ultraviolet lamps with a photoinitiator. More preferably, the partial polymerization is effected by ultraviolet lamps having a majority of their emission spectra between about 280 and 400 nanometers, with a peak emission at about 350 nanometers, and at an intensity of less than amount 20 milliwatts per square centimeter (mW/sq cm). A composition comprising the syrup, additional photoinitiator, optional crosslinking agent (s), and any other desired adjuvants is then mixed, optionally degassed, and coated onto a substrate. Suitable substrates include polymeric films, such as polyester films, paper, metal, ceramic, glass, flexible electrical circuits, and the like. The substrate is optionally treated with a release coating material such as silicone release agents, TEFLON™ coatings, perfluoropolyether coatings, and the like. The coated composition is then exposed to ultraviolet lamps in a low oxygen atmosphere, that is, containing less than about 500 parts per million oxygen (ppm), and preferably less than about 200 ppm to cure the composition to a pressure bondable adhesive. Optionally, the cured screen-printable adhesive can be exposed to other sources of energy such as heat, electron beam, high intensity ultraviolet, and the like, to further crosslink the adhesive.

In another method of making a screen-printable adhesive, the acrylate monomer, the optional comonomer, a free radical initiator, optional crosslinking agent, optional thixotropic agent, and either (1) a polyepoxide resin and a polyepoxide curing agent, (2) core-shell polymer(s), (3) semi-crystalline polymer(s), or (4) amorphous thermoplastics and any other desired adjuvants are mixed together to form a homogeneous mixture. The mixture is coated onto a substrate and then the acrylates are polymerized as described above. If the screen-printable adhesive contains a polyepoxide resin and a polyepoxide curing agent, the polyepoxide resin is then cured as previously described.

In another embodiment of the invention, a heat-curable adhesive composition comprising acrylate monomer, a crosslinking agent (as defined below), polyepoxide resin, a polyepoxide resin curing agent, and electrically conductive material and/or thermally conductive material is formed into an electrically and/or thermally conductive and heat-curable adhesive film. The electrically conductive heat-curable adhesive films are useful for bonding and interconnecting electrical substrates in splicing and grounding applications. The thermally conductive heat-curable adhesive films are useful for bonding substrates for heat transfer applications. Preferably, the heat-curable adhesive films of the invention also contain a photoinitiator and may also contain polymeric modifiers or property enhancing materials such as core-shell materials and thermoplastic polymers.

The heat-curable adhesive films may be tacky or nontacky to the touch and are not required to be screen-printable. Surprisingly, the electrically conductive heat-curable adhesive films of the invention provide acceptable electrical conductive and bond strength performance with a degree of cure of the polyepoxide resin as low as 50 percent. For example, for applications having a resistance of 5 Ohms or less, the resistance remains stable over time, that is, the resistance changes less than 3 Ohms and preferably changes less than 1 Ohm during use. Unexpectedly, the heat-curable adhesive films of the invention may be adequately cured at relatively low temperatures and relatively short cure times. Additionally, the heat-curable adhesive films of the invention are room temperature stable for a period of up to 16 months.

A preferred heat-curable electrically conductive adhesive film comprises a) an acrylic polymer comprising the reaction product of acrylate monomer, a crosslinking agent having acrylate moieties, and photoinitiator; b) polyepoxide resin; c) polyepoxide curing agent; and d) electrically conductive material.

A preferred heat-curable thermally conductive adhesive film comprises a) an acrylic polymer comprising the reaction product of acrylate monomer, a crosslinking agent having acrylate moieties, and photoinitiator, b) polyepoxide resin; c) polyepoxide curing agent; and d) thermally conductive material.

Generally, the polyepoxide resin is present in the adhesive film compositions in a polyepoxide resin:acrylate monomer weight ratio of from 30:70 to 70:30. The preferred polyepoxide:acrylate monomer weight ratio is from 40:60 to 60:40.

Generally, the crosslinking agent is present in the adhesive film compositions in a crosslinking agent:acrylate monomer weight ratio of from 20:80 to 0.1:99.9. The preferred crosslinking agent:acrylate monomer weight ratio is from 10:90 to 2:98.

Generally, the polyepoxide curing agent is present in the adhesive film compositions in a curing agent:polyepoxide resin weight ratio of from 30:100 to 60:100. The preferred curing agent:polyepoxide resin weight ratio is from 35:100 to 50:100.

Generally, the free radical initiator is present in the adhesive compositions in an initiator:total acrylate weight ratio of from 0.1:99.9 to 2:98. The preferred initiator:total acrylate weight ratio is from 1:99 to 0.3:99.7.

Useful polyepoxide resins for use in the heat-curable adhesive films of the invention include those mentioned above for screen-printable adhesive compositions including phenolic polyepoxide resins, halogenated bisphenol polyepoxide resins, novalac polyepoxide resins, and mixtures thereof. The polyepoxide resin may be either liquid or solid so long as acceptable adhesive coating properties and film handling properties are maintained. Preferred polyepoxide resins include solid multifunctional novolac polyepoxide resins (equivalent weight of about 200–240), and liquid bisphenol A polyepoxide resins (equivalent weight of about 172–192). Preferred commercially available polyepoxide resins include those under the trademarks of EPON™ 164, EPON™ 825, and EPON™ 828, all available from Shell Chemical Co., Houston Tex.

Useful acrylate monomers for use in the heat-curable adhesive films of the invention include those mentioned above for screen-printable adhesive compositions including monofunctional (meth)acrylic acid esters of non-tertiary alkyl alcohols having from 2 to 20 carbon atoms in the alkyl moiety, and preferably from 4 to 18 carbon atoms. For purposes of the heat-curable adhesive film embodiments of the invention, useful acrylate monomers also include those acrylate monomers listed above as reinforcing comonomers for use in the screen-printable adhesive compositions. Preferred acrylate monomers or combinations of acrylate monomers are those which are miscible with the polyepoxide resin prior to polymerization of the acrylate and do not solubilize the polyepoxide curing agent. Preferred acrylate monomers include phenoxyethyl acrylate and isobornyl acrylate.

The heat-curable adhesive film compositions of the invention also contain one or more crosslinking agents for crosslinking the acrylate component of the adhesive composition. Generally, the crosslinking agents include compounds having at least two ethylenically unsaturated moiety as well as bi-functional compounds having at least one ethylenically unsaturated moiety. Useful crosslinking agents include those multifunctional acrylates listed above for the screen-printable adhesive compositions as well as bifunctional epoxide-acrylates. Preferred crosslinking agents are those which are miscible with the polyepoxide resin prior to polymerization of the acrylate and do not solubilize the polyepoxide curing agent. Preferred crosslinking agents include urethane and epoxy diacrylate oligomers. Examples of useful commercially available crosslinking agents include those under the trademarks EBECRYL™ 230, EBECRYL™ 3605, and EBECRYL™ 8804 from UCB Radcure Inc., Smyrna, Ga., and CN 104™ from Sartomer Co., Exton, Pa.

The heat-curable adhesive films of the invention contain a heat-activatable polyepoxide curing agent. Preferably, the heat-activatable curing agent is a modified aliphatic amine curing agent that is insoluble in the adhesive composition matrix at room temperature. Generally, modified aliphatic amines include adducts of an amine with epoxy resins, alkylene epoxides or acrylonitrile and condensation reaction products of an aliphatic amine with fatty acids or mannich bases. Preferably, the polyepoxide curing agent is insoluble in the polyepoxide resin at a temperature at about 20° C. and is soluble in the polyepoxide resin upon heating the polyepoxide resin to a temperature of about 60° C. "Insoluble polyepoxide curing agent" means a curing agent which does not cause substantial curing of the polyepoxides over a prolonged period of time at room temperature. The insolubility of the curing agent in the adhesive composition matrix at ambient temperature provides adhesive films of the invention that are shelf stable for up to about 16 months. A preferred modified aliphatic amine curing agent is a reaction product of a novalac polyepoxide resin and a di-primary aliphatic amine. A preferred polyepoxide curing agent is available under the trademark ANCAMINE™ 2337S, available from Air Products and Chemicals, Inc., Allentown, Pa. In practice, the insoluble curing agent is uniformly dispersed throughout the adhesive composition. Additionally, accelerators for the polyepoxide curing reaction may be optionally added to the adhesive compositions of the invention. Useful accelerators include those listed about for use in screen-printable adhesive compositions.

The heat-curable adhesive films of the invention also preferably include a free radical initiator to polymerize the acrylate containing acrylate component (s) of the adhesive composition. Useful initiators include those mentioned above for use in screen-printable adhesive compositions and are preferably photoinitiators. Useful photoinitiators in the adhesive film compositions of the invention include those listed above for use in screen-printable adhesive compositions. Examples of preferred photoinitiators include 2,4,6-trimethylbenzoyldiphenylphosphine oxide and a blend of bis(2,6,-dimethoxybenzoyl)-2,4,4-trimethylpentylphosphine oxide and 2-hydroxy-2-methyl-1-phenyl-2-propanone. Useful commercially available photoinitiators include those under the trademarks LUCIRIN™ TPO, from BASF Corp., Charlotte N.C. and CGI 1700™ from CIBA-GEIGY, Tarrytown, N.Y. Of course, the acrylate components may also be polymerized by exposure to ionizing radiation such as electron beam radiation as is known in the art.

The heat-curable adhesive films of the invention preferably contain an electrically conductive agent or material. Useful electrically conductive materials include those listed above for screen-printable adhesive compositions including metal particles and spheres and metal or polymeric or ceramic particles and spheres that are coated with an electrically conductive coating and also include electrically conductive woven and non-woven materials, whiskers, fibers, and flakes. Some of the electrically conductive materials listed above also exhibit useful thermal conductivity and include metal particles. Preferred electrically conductive particles include silver coated glass spheres, gold coated nickel particles, and silver coated nickel particles. Preferred electrically conductive particles include those under the trademarks CONDUCT-O-FIL™ S-3000-S-3M and S-3000-S-3MM, from Potters Industries Inc., Parsippany, N.J., and gold coated nickel particles, available from Novamet, Inc., Wykoff, N.J.

The heat-curable adhesive films of the invention may also include a thermally conductive, electrically insulating material. Thermally conductive, electrically insulating materials are typically ceramics, including aluminum oxide, glass, boron nitride, zinc oxide, and non-ceramics such as diamond. The materials may be in the same forms as those listed above for electrically conductive materials. Preferred thermally conductive, electrically insulating materials include aluminum oxide and boron nitride.

The amount of electrically conductive materials used in the heat-curable adhesive films of the invention depends upon the type of substrate to be bonded and its end use. For example, for interconnecting a flexible circuit to a circuit board or to a liquid crystal display (LCD) where anisotropic or "z" axis electrical conductivity is required, the heat-curable adhesive film composition contains from 1 to 20, and preferably, from 1 to 10 percent of electrically conductive materials by volume of the composition. In bonding for shielding or grounding applications, for example, grounding a printed circuit board to a heat sink, or for electromagnetic interference (EMI) shielding, the heat-curable adhesive film composition contains from 1 to 80, and preferably, from 1 to 70 percent electrically conductive material by volume of the adhesive composition.

In adhesive bonding applications requiring a heat-curable adhesive film having both thermal and electrical conductivity, the heat-curable adhesive film composition contains from 5 to 80 and preferably, from 5 to 70 percent electrically conductive material by volume of the adhesive composition. The thermally conductive material is present in an amount of from 5 to 80 and preferably, from 5 to 70 percent thermally conductive material by volume of the adhesive composition. Alternatively, it is possible to use from 5 to 80 percent by volume of materials that are both electrically conductive and thermally conductive, for example, solid metal particles in the heat-curable adhesive films of the invention.

In adhesive bonding applications requiring heat-curable adhesive films having only thermal conductivity, the adhesive composition contains from 5 to 80 and preferably, from 5 to 70 percent thermally conductive electrically insulating material by volume of the adhesive composition.

The heat-curable adhesive compositions of the invention may also include materials which enhance adhesive composition processing, adhesive film handling, and mechanical properties of the heat cured film. Such materials include thermoplastic polymers and core-shell impact modifiers including those core-shell polymers described for use in screen-printable adhesive compositions. Preferred property enhancing materials include methacrylate/butadiene/styrene core-shell impact modifiers, phenoxy thermoplastic resins, and amorphous linear saturated copolyesters. Examples of commercially available property enhancing materials include PARALOID™ EXL-2691A core-shell particles, from Rohm & Haas Co., Philadelphia, Pa., PKHP™ 200 phenoxy resin particles, from Phenoxy Associates, Rock Hill, S.C., and BOSTIK™ 7900 copolyester, from Bostik, Middleton, Mass.

Generally, the thermoplastic polymer is present in the adhesive film compositions in a thermoplastic polymer:adhesive composition weight ratio of from 0:100 to 10:90 and preferably, from 0:100 to 8:92. Generally, the core-shell impact modifiers are present in the adhesive film compositions in a core-shell:adhesive composition weight ratio of from 0:100 to 15:85 and preferably, from 0:100 to 10:90.

The heat-curable adhesive films of the invention are generally made by first forming a heat-curable adhesive composition. Generally, the heat-curable adhesive composition is made by dissolving and dispersing the components together until a homogeneous mixture is obtained. The adhesive composition is then coated onto a substrate, such as a release liner or between two release liners, as described above for the screen-printable adhesive compositions. The heat-curable adhesive compositions can be coated onto a substrate by methods including knife, knife-over-bed, roll, and die coating. The acrylate monomer and crosslinking agent are then polymerized in the presence of the polyepoxide resin and the other components to form a heat-curable adhesive film. The acrylate monomer and crosslinking agent are preferably polymerized by exposing the coated adhesive as composition to low intensity UV irradiation in an oxygen free atmosphere as described above for the screen-printable compositions. Additionally, the time and exposure levels to the irradiation have to be sufficient to cause nearly complete polymerization and crosslinking of the ethylenically unsaturated groups, such as the acrylates and the bi-functional compounds when present, without causing the reaction of the heat-activatable curing agent and the polyepoxide resin. The heat-curable adhesive films may be used in adhesive coated articles, such as, single or double sided tapes or in adhesive sheets as described above for the screen printable adhesive compositions. Preferably, the heat-curable adhesive film is prepared between two release liners to give a transferable heat-curable adhesive film, or transfer tape.

When the heat-curable adhesive has been prepared between two release liners, one release liner is removed, the heat-curable adhesive film is placed on the substrate to be bonded, the second release liner is removed and the second substrate is positioned on the heat-curable adhesive film.

Once the heat-curable adhesive film has been properly positioned with respect to the substrates to be bonded, the film is heated for a time at a temperature sufficient to cure the polyepoxide resin to obtain a degree of cure of at least 50 percent as measured by differential scanning calorimetry, the actual time and temperature depending upon the specific components in the heat-curable adhesive composition and the substrates to be bonded. Generally, the adhesive films of the invention are cured at a temperature range of from 90 to 180° C. and a cure time of from 15 seconds to 5 minutes. Preferably, the adhesive films are cured at a temperature of between 110 and 160° C. and a cure time of from 15 seconds to up to 3 minutes. More preferably, the adhesive films are cured in from 15 to 90 seconds at a curing temperature of from 120 to 150° C.

The amount of pressure required for bonding the heat-curable adhesive films of the invention depends upon the substrate to be bonded and its end use. Some substrate/adhesive film combinations may not require any applied pressure. For example, to form an electrical interconnect between substrates, sufficient pressure is applied so to cause the adhesive to flow enough to allow the conductive material to contact the substrates to form an electrically conductive adhesive bond. For bulk electrical and thermal applications, sufficient pressure is applied to the heat-curable adhesive film to cause uniform wetting of the adhesive onto the substrate surface. The amount of pressure required (if any) may be determined by one skilled in the art without undue experimentation.

The heat-curable adhesive films can be cured by using any known means of applying heat and if required, pressure, for example hot bar bonding or by placing the substrate under initial pressure followed by heating.

Other adjuvants can be included in the composition in amounts needed to effect the desired properties as long as they do not effect the polymerization of the acrylate or the curing of the polyepoxide resin and the desired end properties. Useful adjuvants include dyes, pigments, fillers, and coupling agents.

The following non-limiting examples illustrate specific embodiments of the invention.

TEST METHODS—SCREEN-PRINTABLE ADHESIVES

Electrical Conductivity

This test is a measurement of the electrical resistance through the adhesive bond and a conducting circuit. Resistance readings should be less than about 100 Ohms, and preferably less than about 20 Ohms.

A test sample is prepared by bonding a straight line 8 mil (0.2 mm) pitch adhesive coated flexible circuit (3M™ Brand Heat Seal Connector without adhesive, available from Minnesota Mining & Manufacturing Co., St. Paul, Minn.) between a printed circuit board (FR-4 test board) and an ITO coated glass plate (20 Ohms/square sheet resistivity, available from Nippon Sheet Glass, Japan). The circuit traces of the flexible electrical circuit are aligned to the corresponding traces on the circuit board and bonded by hand pressure for a pressure-sensitive adhesive or by hot bar bonding for a heat activated adhesive. Hot bar bonding is accomplished with a 3 mm by 25.4 mm thermode (TCW 125, from Palomar Systems, Carlsbad, Calif.) set at 145° C. and 800 psi (5516 kiloPascals) for 10 seconds. The other end of the flexible circuit is bonded to the ITO coated side of the glass plate. For samples that are flood coated, that is, having adhesive covering the entire flexible circuit, only the area contacted by the thermode is bonded to the circuit board. For screen printed samples, only certain areas are printed with the adhesive.

Electrical resistance of the adhesive interconnection is measured by the four-wire method using the principles described in ASTM B 539–90 such that the net resistance not due to the interconnection is minimized to approximately 150 milliOhms. Results include the average resistance (AVG), the minimum resistance (MIN), and the maximum resistance (MAX). Samples are tested after bonding (INIT) and after aging at 60° C. and 95 percent relative humidity for 10 days (AGED).

90° Peel Adhesion

This test is conducted by adhering a flexible electrical circuit with the adhesive to either an FR-4 circuit board or to an indium tin oxide (ITO) glass plate having 20 Ohms/square sheet resistivity (available from Nippon Sheet Glass, Japan) by hand for a pressure-sensitive adhesive, or using a 3 mm by 25.4 mm pulsed heat thermode (TCW 125, from Palomar Systems, Carlsbad, Calif.) set at 145° C. and 800 psi (5516 kiloPascals) for 10 seconds. The circuit board is mounted in a fixture in the lower jaw of an Instron™ Tensile Tester so that the flexible circuit, mounted in the upper jaw, would be pulled off at a 90° angle. The width of the flexible circuit is 1.9 to 2.5 cm. The jaw separation speed was 2.54 millimeters per minute and results are recorded in grams/centimeter. Samples are tested after bonding (INIT) and after aging at 60° C. and 95 percent relative humidity for 10 days (AGED) and results are reported in grams/centimeter (g/cm).

Molecular Weights

The molecular weight of the syrup is determined by conventional gel permeation chromatography. The instrumentation includes a Hewlett-Packard Model 1090 Chromatograph, a Hewlett-Packard Model 1047A Refractive Index Detector, and a variable wavelength UV detector set at 254 nanometers. The chromatograph was equipped with an ASI Permagel 10 micron column. The system was calibrated with polystyrene standards from Pressure Chemical Co. The signal was converted to digital response using Nelson Analytical hardware and software and the molecular weight (weight average) is determined using software from Polymer Labs. GPC test methods are further explained in *Modern Size Exclusion Liquid Chromatography: Practice of Gel Permeation Chromatography*, John Wiley and Sons, 1979.

The samples are prepared by pre-treating with diazomethane in diethyl ether. After drying, the samples are dissolved in tetrahydrofuran (THF) at a concentration of 2.0 milligrams per milliliter of THF and filtered through a 0.2 micrometer TEFLON™ filter. Samples are injected into the columns at volumes of 100 micro-liters and eluted at a rate of 1 milliliter per minute through columns maintained at 21° C.

Viscosity, Measured Yield Point, Calculated Yield Point

The rheological characteristics are determined on a Carri-Med CS Rheometer. The Rheometer is of the cone and plate type with a cone angle of 2:00:00 deg:min:sec, and a cone diameter of 4.0 cm. The gap is 55 microns, and the system inertia is 203.3 dyne/square centimeter (20.3 Pascals). The starting and end temperatures are 25° C. The starting stress is 10.00 dyne/square centimeter (1.0 Pascals), and the end stress is 1750 dyne/square centimeter (175 Pascals). Viscosity at infinite shear and yield points are measured and data is reported as (a) Viscosity in centipoise (cps), (b) Measured Yield in Pascals., and (c) Calculated Yield in Pascals. The Calculated Yield and the Viscosity is determined using the Casson Model as described above.

EXAMPLE 1 and COMPARATIVE EXAMPLE C1

A pressure-sensitive adhesive composition was prepared by mixing 67 parts isooctyl acrylate (IOA), 33 parts isobornyl acrylate (IBA), 0.1 pph (part per 100 parts of acrylate and comonomer) benzil dimethyl ketal photoinitiator (ESCACURE™ KB-1 photoinitator from Sartomer), and 0.1 pph carbon tetrabromide in a glass jar, purging the jar with nitrogen, and exposing to ultraviolet radiation from fluorescent black lights which have at least 90 percent of their spectral output between 300 and 400 nanometers with a peak emission at about 350 nanometers until a viscous syrup having a viscosity estimated to be about 2000 to 3000 centipoise was formed. To the syrup was added 0.1 pph of 1,6-hexanedioldiacrylate (HDDA) and 0.2 pph of a second photoinitiator (LUCIRIN™ TPO available from BASF). The adhesive was then screen printed onto a polyester film using a 60 mesh screen on a rotary screen printer (X-Cel Rotary Screen Printer from Stork). The adhesive formed a fairly uniform coating on the substrate with a few bubbles, and slight stringing of the adhesive.

Comparative Example C1 was prepared as for Example 1 except that 0.04 pph KB1 photoinitiator was used in preparing the syrup and no chain transfer agent was used. The resulting adhesive did not screen print well and exhibited stringing between the screen and the substrate which caused large bubbles and holes in the adhesive coating and a very non-uniform coating.

The examples were cured by exposing the coated adhesives to medium pressure mercury lamps to form an adhesive. The resulting adhesives were tacky and pressure-sensitive.

The adhesives of both examples were also tested for shear viscosity and shear elongation as a function of shear and extrusion rate. The shear viscosity was measured on a Bohlin CS Rheometer. Extensional viscosity was measured on an RFX viscometer from Rheometrics. Comparative Example C1 exhibited non-Newtonian rheological behavior that is typical of ultraviolet light cured adhesives as evidenced by shear thinning behavior and an apparent viscosity increase with increasing extension rate. The Trouton ratio, defined as the extensional viscosity/shear viscosity increased with increasing strain rate for C1. Example 1 exhibited a more Newtonian shear viscosity, which remained fairly constant with increasing shear, and the extensional viscosity and Trouton ratio were essentially constant as the strain rate was increased.

EXAMPLES 2–3

Heat-activatable adhesives were prepared according to the procedure in Example 1 except that the syrup composition was 43 parts IOA, 57 parts IBA, 0.1 pph benzil dimethyl ketal photoinitiator, and 0.1 pph carbon tetrabromide. The light exposure time was varied to form syrups with a viscosity of about 16,000 centipoise (cps) for Example 2 and about 2000 cps for Example 3. Viscosities were measured on a Brookfield RV Viscometer at a spindle speed of 5 rpm (Spindle #5) at room temperature. An additional 0.3 pph benzil dimethyl ketal photoinitiator and 0.1 pph HDDA were added to each of the syrups before screen printing.

Both adhesives were screen printed on an AMI 850 screen printer. The screen mesh, squeegee speed, squeegee angle, and squeegee hardness were varied to obtain the best coating possible with each of the adhesive compositions. The target coating thickness was 0.0254 mm (1 mil).

The composition of Example 2 was printable but required slow squeegee speeds to reduce the number of bubbles in the coating. The composition of Example 3 had fewer bubbles during printing, but had flowed after printing to reduce edge definition. The coated adhesives were cured using two 15 Watt fluorescent black lamps (350 nanometer black lamps from Sylvania) in a nitrogen-rich atmosphere for about 6 minutes with the sample about 3 inches (7.62 cm) away from the lamps. The cured adhesives were essentially tack-free at room temperature.

EXAMPLE 4

A heat-activatable adhesive composition was prepared by mixing 2 parts of the composition of Example 3 and 1 part of the composition of Example 2. The resulting composition had a viscosity estimated to be between about 5000 and 8000 centipoise. This composition produced the most well defined edges while being easily screen printed over a wide range of process conditions.

EXAMPLES 5–6 and COMPARATIVE EXAMPLE C2

For Example 5, a heat-activatable adhesive syrup having a viscosity of about 7680 cps (Spindle #5 at 5 rpm on Brookfield Viscometer) was prepared according to the procedure of Example 1 having a composition for Example 5 of 40 parts IOA, 60 parts IBA, 0.1 pph benzil dimethyl ketal photoinitiator, and 0.1 pph carbon tetrabromide.

For Example 6, a pressure-sensitive adhesive syrup having a viscosity of about 6240 cps was prepared according to the procedure of Example 1 having a composition of 65 parts IOA, 35 parts IBA, 0.1 pph benzil dimethyl ketal photoinitator, and 0.1 pph carbon tetrabromide.

For Comparative Example C2, a heat-activatable adhesive syrup having a viscosity of about 8080 cps was prepared as in Example 5 except that no carbon tetrabromide was added.

Before coating, all of the syrup compositions further included 0.05 pph HDDA and 0.3 pph LUCIRIN™ TPO photoinitiator. Additionally, Example 6 also contained 25 pph of a hydrocarbon tackifying resin (REGALREZ™ 6108 available from Hercules).

The adhesives were screen printed. Examples 5 and 6 screen printed well with good edge definition. Comparative Example C2 exhibited severe stringing of the adhesive resulting in an unacceptable printed image.

Examples 5 and 6 exhibited rheological behavior similar to Example 1. The shear viscosity of these Examples, as a function of shear rate, remained relatively Newtonian up to about 100 seconds$^{-1}$. The shear viscosity, as a function of shear rate for Comparative Example C2 dropped rapidly, that is, about an order of magnitude over the same shear rate range. This rheological behavior is similar to Comparative Example C1.

EXAMPLE 7

A heat-activatable adhesive composition was prepared as in Example 6 with the addition of 2 pph fumed silica (CAB-O-SIL™ M5) to the syrup. The syrup was screen printed and had improved edge definition and substantially no flow of the coated adhesive before curing.

EXAMPLES 8–13 and COMPARATIVE EXAMPLE C3

Heat-activatable adhesive compositions were prepared according to the method of Example 1 using 40 parts IOA, 60 parts IBA, 0.1 pph KB-1, and the amount (AMT) in pph and type (TYPE) of chain transfer agent (CTA) shown in Table 1. The chain transfer agents used were $CBr_4$ (carbon tetrabromide), IOTG (iso-octyl thiol glycolate) and NDDM (n-dodecyl mercaptan). Various amounts of crosslinker (HDDA) in pph were added to the syrup as well as 0.3 pph TPO photoinitiator. Molecular weights were determined for Examples 9, 11, and Comparative Example C3. Examples 9 and 11 were screen printable. The rheology profiles, that is, shear viscosities, of Examples 10, 12, and 13 were similar to Examples 5 and 6 and should be screen printable. Comparative Example C3 is not expected to be screen printable because its rheological profile was similar to Comparative Examples C1 and C2.

TABLE 1

| Example | CTA-Amt/Type | HDDA | TPO | Molecular Weight |
|---|---|---|---|---|
| 8 | 0.02/CBr₄ | 0.025 | 0.3 | NT* |
| 9 | 0.04/CBr₄ | 0.05 | 0.3 | 453,000 |
| 10 | 0.06/CBr₄ | 0.025 | 0.3 | NT |
| 11 | 0.1/CBr₄ | 0.025 | 0.3 | 263,000 |
| 12 | 0.1/NDDM | 0.025 | 0.3 | NT |
| 13 | 0.1/IOTG | 0.025 | 0.3 | NT |
| C3 | None | — | — | 1,570,000 |

*NT-Not Tested

EXAMPLE 14

A heat-activatable conductive adhesive syrup was prepared according to the procedure of Example 1 by partially polymerizing 40 parts IOA, 60 parts IBA, 0.1 pph benzil dimethyl ketal photoinitiator, and 0.04 pph carbon tetrabromide. An adhesive composition was prepared by mixing the syrup with 0.05 pph HDDA and 0.3 pph TPO photoinitiator (LUCIRIN™ TPO, available from BASF) until both were dissolved. Then 4 pph fumed silica (CAB-O-SIL™ M5) and 20 pph conductive nickel spheres (CNS, air classified −20/+10 μm available from Novamet, Inc.) were dispersed into the composition with a high shear mixer. The 20 pph of nickel spheres is 5 percent by volume of the adhesive composition. The adhesive composition was then screen printed onto a flexible electrical circuit (3M™ Brand Heat Seal Connector without adhesive, available from Minnesota & Manufacturing Co., St Paul, Minn.) using a flat bed screen printer (Model 2BS Roll to Roll Screen Press System from Rolt Engineering Ltd.) with a 200 mesh polyester screen with 31° bias and 25 mil (0.635 mm) emulsion thickness and a 60 durometer rounded edge squeegee. The adhesive composition was printed in the print/flood mode with a squeegee pressure of 20 psi (138 kiloPascals), 20 inches per second squeegee speed (50.8 cm/sec) and 20 inches per second (50.8 cm/sec) flood blade speed, and a minimum squeegee angle. The adhesive coating thickness was 43 to 53 μm.

The screen printed adhesive was cured by exposing the adhesive to fluorescent black lights as described in Example 1 at an intensity of about 4.5 to 5.5 milliWatts/square centimeter, and a total energy of about 335 to 350 milliJoules/square centimeter. The resulting adhesive was essentially non-tacky at room temperature but became tacky when heated to about 35° C. The printed flexible circuit was tested for electrical resistance and peel adhesion to both and ITO glass substrate and to a FR-4 circuit board. Test results are shown in Table 2.

EXAMPLE 15

A heat-activatable conductive adhesive was prepared as in Example 14 except that the amount of HDDA was reduced to 0.035 pph and the conductive nickel spheres were 2 percent gold coated conductive nickel spheres. The adhesive was then screen printed to a thickness of about 30 to 40 μm on the ends of the circuit traces of a flexible circuit. The adhesive was then cured as described above. This cure was followed by an exposure to mercury arc lamps for an exposure of 1100 milliJoules/square centimeter. The portion of the flexible circuit that was not adhesive coated had been coated with a non-adhesive protective cover coat (ENPLATE™, from Enthone-OMI, Inc.) The resulting flexible circuit was tested for electrical resistance and peel adhesive as described above except that the bonding pressure was reduced from 800 psi (5516 kiloPascals) to 540 psi (3723 kiloPascals), and the AGED results reported are after 13 days of aging. Test results are shown in Table 2.

TABLE 2

| | Example 14 | | Example 15 | |
|---|---|---|---|---|
| | INIT | AGED | INIT | AGED |
| RESISTANCE | | | | |
| AVG-Ohms | 2.3 | 9.8 | 2.2 | 12.1 |
| MIN-Ohms | 2.1 | 4.4 | 2.0 | 5.9 |
| MAX-Ohms | 2.6 | 18.0 | 4.9 | 20.6 |
| Peel Adhesion | | | | |
| Glass-g/cm | 826 | 1176 | 617 | 1883 |
| Board-g/cm | 1184 | 2836 | 834 | 1250 |

The results in Table 2 show that the adhesives of the invention are suitable for coating on to flexible circuits to provide electrical connections.

EXAMPLE 16

A solution was prepared by blending (by weight percent) 30.1 IOA, 34.0 percent IBA, 16.02 percent isobutyl methacrylate polymer (ELVACITE™ 2045 from ICI Americas), and heating at 80° C. and stirring until the polymer was dissolved. The amount by parts was 37.6 parts IOA, 42.4 parts IBA, and 20 parts isobutylmethacrylate. An adhesive syrup composition was prepared by adding to the solution 3.2 percent fumed silica (CAB-O-SIL™ M5 silica from Cabot Corporation.), 16 percent gold coated nickel spheres (described in Example 14), 0.0192 percent photoinitiator (LUCIRIN™ TPO), 0.32 percent antioxidant (IRGANOX™ 1010 from Ciba Geigy Corp.), and 0.16 percent crosslinking agent (EBECRYL™ 230). The silica was mixed into the composition using a high shear mixer. The resulting syrup was tested for viscosity and yield point and data is shown in Table 3. A flexible circuit was prepared as in Example 15. The resulting circuit was heat bondable, and had acceptable electrical resistance.

EXAMPLES 17–20

Adhesive compositions were prepared according to the procedure of Example 16.

Example 17 had a composition of 52 parts IOA, 28 parts IBA, 20 parts styrene butadiene copolymer (K-resin 01 from Phillips Petroleum), 0.25 percent photoinitiator (LUCIRIN™ TPO), 4 percent fumed silica (CAB-O-SIL™ M5 silica), 0.3 percent antioxidant (IRGANOX™ 1010), and 0.18 percent carbon tetrabromide.

Example 18 was prepared as in Example 17, except that the composition contained 32 parts IOA, 48 parts IBA, and 20 parts styrene butadiene copolymer.

Example 19 had a composition as in Example 16 except that it contained 52 parts IOA, 28 parts IBA, and 20 parts isobutyl methacrylate polymer.

Example 20 was prepared as in Example 19 except that it contained 32 parts IOA, 48 parts IBA, and 20 parts isobutyl methacrylate polymer.

TABLE 3

| Example | Viscosity (cps) | Measured Yield (Pa) | Calculated Yield (Pa) |
| --- | --- | --- | --- |
| 16 | 968.2 | 25.5 | 52.2 |
| 17 | 1038 | 4.5 | 61.3 |
| 18 | 1187 | 29.0 | 46.4 |
| 19 | 771.2 | 13.2 | 26.0 |
| 20 | 1371 | 20.2 | 42.8 |

EXAMPLES 21–22

Screen-printable adhesives were made using semi-crystalline polymers. Example 21 had a composition of 40 parts IOA, 60 parts IBA, and 8.1 parts of ethylene/ethyl acrylate/glycidyl methacrylate terpolymer, a semi-crystalline polymer, available under the trademark LOTADER™ 8900 from ELF Atochem. Example 22 had a composition of 100 parts phenoxyethyl acrylate and 8.7 parts of ethylene/acrylate/carbon monoxide terpolymer, a semi-crystalline polymer, available under the trademark ELVALOY™ 441, available from DuPont Company. The above compositions were prepared by mixing the acrylate monomers with the thermoplastic terpolymers and heating the mixtures at about 80° C. for several hours until clear solutions were obtained. Upon cooling to room temperature, the solution became hazy and were thixotropic. Both solutions were screen printable. Yield points and viscosities are shown below in Table 4.

EXAMPLES 23–24

Screen-printable adhesives were made using polyepoxide resins. Example 23 was prepared by mixing 12 g phenoxy ethyl acrylate (100 parts), with 8 g (67 parts) of a cresol novolac polyepoxide resin (EPON™ 164, from Shell Chemical Co., Houston, Tex.) in a brown jar, and rolling the jar under a sun lamp for about 2 hours until a clear solution was obtained. Two-and-one-half grams of methacrylate/butadiene/styrene polymer (PARALOID™ EXL2691, from Rohm & Haas, Philadelphia, Pa.) was dispersed into the solution using an impeller blade turning at about 7000 rpm for about 30 minutes. Then 0.8 g of hydrophobic silica (AEROSIL™ R812 Silica, from DeGussa Corporation, Ridgefield Park, N.J.) was added and mixed with the impeller for about 15 minutes. During mixing, the mixture became warm to the touch. The mixture was cooled to about 20° C. and 0.1 g of liquid photoinitiator (CGI 1700™, from Ciba Geigy Corp.), 0.2 g glycidylpropyl trimethoxysilane coupling agent GPMS™, from Huls, Piscataway, N.J.), 2.75 g of a modified amine polyepoxide curing agent (ANCAMINE™ 2337S, from Air Products and Chemicals, Inc., Allentown, Pa.) 0.5 g epoxy diacrylate oligomer (EBECRYL™ 3605, from UCB Radcure Inc.), and 4.0 g of conductive particles (Air classified −20/+10 gold coated nickel particles, from Novamet, Inc., where) were added to the mixture and mixed at slow speed with a paddle mixer. The resulting adhesive composition had a viscosity and yield point as shown in Table 4.

The adhesive composition of Example 23 was screen printed onto a flexible circuit substrate (3M™ Brand Heat Seal Connector without adhesive, Minnesota Mining & Manufacturing, St. Paul, Minn.) using a 250 mesh polyester screen. The printed adhesive composition was cured under ultraviolet black light lamps having an emission spectrum primarily between about 300 and 400 nanometers, with a peak emission around about 350 nanometers, for about 5 minutes. The intensity was about 2 mW/sq. cm. The printed adhesive was then bonded to FR4, ITO coated glass and heat cured with a heated bar at a temperature of about 150° C. for about 20 seconds. The substrate had a measured conductivity of 1.26 Ohms with a range of 0.64 to 2.0 (2 samples, 15 measurements each).

Example 24 was prepared as in Example 23 except that the composition was as follows: 8 g phenoxyethyl acrylate (80 parts), 2 g isobornyl acrylate (20 parts), 5 g polyepoxide resin (EPON™ 1002, from Shell Chemical Co.), 5 g diglycidyl ether of bisphenol A polyepoxide resin (EPON™ 825, from Shell Chemical Co.), 5 g methacrylate/butadiene/styrene polymer (PARALOID™ EXL2691A, from Rohm & Haas), 0.8 g hydrophobic silica thixotrope (AEROSIL™ R812, from DeGussa Corporation), 0.2 g liquid photoinitiator (CGI 1700™, from Ciba Geigy Corp.), 0.2 glycidylpropyl trimethoxysilane coupling agent (GPMS™, from Huls), 2.22 g polyepoxide curing agent (ANCAMINE™ 2337S, from Air Products and Chemicals, Inc.), 0.5 epoxy diacrylate oligomer (EBECRYL™ 3605, from UCB Radcure Inc.), and 4.0 g conductive particles (Air classified −20/+10 gold coated nickel particles). The resulting adhesive composition had a yield point and viscosity as shown in Table 4 and is screen printable.

EXAMPLES 25–26

The screen-printable adhesives of Examples 25 and 26 were made using "core-shell" polymers. Example 25 was prepared by dispersing 25 parts of a methylene/butadiene/styrene core-shell polymer KANE ACE™ M901, from Kaneka Co, into a mixture of 40 parts isooctyl acrylate and 60 parts isobornyl acrylate with an impeller blade turning at 7000 rpm and mixing for about 0.5 hour. The solution became warm during mixing. The adhesive composition was clear and thixotropic upon cooling to room temperature. Example 26 was prepared as in Example 25 except the composition was as follows: 40 parts isooctyl acrylate, 60 parts isobornyl acrylate, and 15.6 parts acrylic core-shell polymer (PARALOID™ KM 330, from Rohm & Haas). After cooling, Example 26 was clear and thixotropic.

TABLE 4

| Example | Yield Point-(Pa) Measured | Yield Point-(Pa) Calculated | Yield Point Regression | Viscosity (cps) Calculated |
|---|---|---|---|---|
| 21 | — | 11.4 | 0.987 | 184 |
| 22 | 22.54 | 24.5 | 0.994 | 2820 |
| 23 | 22.54 | 9.7 | 0.994 | 4952 |
| 24 | 83.92 | 41.5 | 0.947 | 1350 |
| 25 | 83.92 | 16.6 | 0.996 | 1053 |
| 26 | 57.61 | 19.8 | 0.988 | 534 |

General Preparation of Heat-Curable Adhesive Film Compositions

Method I

The aromatic polyepoxide, monofunctional acrylate monomer and diacrylate oligomer were weighed into a 4 ounce clear glass jar, sealed with a cap, placed in a forced air oven set at at 90° C. for a period of 30 minutes, removed and agitated on a shaker table for 15 additional minutes to complete the dissolution of the components as indicated by a visually clear appearance.

The resulting solution was stirred, while still warm, with a 0.79 inch (20 mm) diameter disk impeller while being heated to and maintained at 100° C. (as measured by a thermocouple positioned at the bottom of the glass jar) on a hot plate. The mixing speed was adjusted to about 4000 rpm to provide a doughnut-like flow pattern around the impeller blade. Thermoplastic resin was added slowly by hand in portions, to avoid agglomeration, into the vortex and then mixed at 100° C. until fully dissolved. Complete dissolution of the thermoplastic resin was determined by a change in appearance of the mixture from opaque to clear. Dissolution was usually complete within 2 hours or less depending upon the coarseness of the powder, with finer powders requiring less time. For example, a phenoxy thermoplastic having a particle size of about 200 micrometers was completely dissolved in about 30 minutes or less while an amorphous, linear saturated copolyester thermoplastic having a particle size much greater than 200 micrometers required approximately 2 hours.

Next, the photoinitiator required for the acrylate polymerization was ground to a fine powder with a mortar and pestle and then added in a single portion to the polyepoxide/acrylate monomer/crosslinker /thermoplastic resin solution at room temperature. The capped jar with the mixture was placed on a roller mill for about 2 hours to effect dissolution of the photoinitiator. During this time, the jar was protected from exposure to light.

The polyepoxide curing agent powder was then added in a single charge to the reaction mixture and dispersed by mixing for about 3 to 5 minutes with motor/disk impeller described above. Mixing was done at a speed which maintained the resin temperature at about 40° C. or less to prevent undesired reaction of the polyepoxide and curing agent. Next, the conductive powder was added and dispersed in a similar manner. Finally, the capped jar with the dispersed mixture was placed on a roller mill, protected from exposure to light, and allowed to rotate overnight to provide more complete dispersion of the polyepoxide curing agent and conductive particles. A uniform dispersion having a viscosity of about 5,000 to about 15,000 centipoise was obtained. This was protected from light until further use.

Method 2

The acrylate-containing monomer(s) (includes acrylate monomer, and crosslinking components) were weighed into a clear glass jar followed by addition of the aromatic polyepoxide(s), the jar was capped, placed on a roller mill, and rotated for about 1 to 24 hours until a clear solution was obtained. Where solid polyepoxides were employed this required approximately 24 hours.

Next were added, in order, a liquid photoinitiator and a liquid silane coupling agent each in a single portion. This was mixed by hand at room temperature for between 15 and 30 seconds until a clear solution was obtained. Once the photoinitiator was added, all subsequent steps were carried out under yellow light.

Core/shell-type particles were then blended, one spatula-size portion at a time, into the solution using the above-mentioned disk impeller and mixed at a speed of about 4000 rpm for about 15 to 20 minutes, to ensure thorough dispersion. During this time, the mixture became hot to the touch. An opaque dispersion resulted.

Fumed silica was then added to the very warm mixture in a single charge with stirring, using the previously described disk impeller at a speed of about 4000 rpm for about 15 to 20 minutes, to ensure thorough dispersion. During this time the mixture became hot to the touch.

After allowing the mixture to cool to room temperature the polyepoxide curing agent powder and conductive particles were added in a single combined portion and mixed using the aformentioned impeller blade at a speed of about 100 to 200 rpm for about 10 to 15 minutes to disperse these two components. An opaque dispersion having a viscosity between about 1000 and 5000 centipoise was obtained. The composition was stored at about 40° F. (4° C.) until further use.

General Preparation of Heat-Curable Adhesive Bonding Films

Method 1

Adhesive films were prepared by coating the adhesive compositions between two release liners and exposing the coated adhesives to ultraviolet (UV) irradiation.

More specifically, the adhesives were coated using a 6 inch (15.2 cm) wide knife-over-bed station. The knife was locked in position to maintained a fixed gap. The knife gap was adjusted, using a feeler gauge, to a height of 0.0025 inches (63.5 micrometers) greater than the combined thickness of the two release liners employed. The adhesive composition was poured between the two 0.002 inch (50.8 micrometers) silicone-coated polyester release liners, which were then pulled between the knife and bed forcing the adhesive under the knife.

The coated adhesives were exposed to low intensity UV irradiation from one side, through the release liners, under oxygen free conditions using two adjacent General Electric FT15T8-BL fluorescent lamps which were positioned about one inch from the release liner. The exposure time was 5 minutes for a total dose of 940 mJ/cm$^2$. The intensity was measured using a UVIRAD UV Integrating Radiometer (Model UR365CH3 from Electronic Instrumention & Technology, Sterling, Va.). The values reported for dosage were measured according to National Institute for Standards and Testing (NIST) methods. Adhesive films having a thickness of about 0.0025 inches (63.5 micrometers) were obtained.

Method 2

Adhesive films were prepared by coating the adhesive compositions between two release liners and exposing the coated adhesives to UV irradiation as described in Method 1 with the following modifications.

The knife gap was adjusted, using a feeler gauge, to a height of 0.002 inches (50.8 micrometers) greater than the combined thickness of the two release liners employed.

The coated adhesives were exposed to low intensity UV irradiation from one side, through the release liner, under oxygen free conditions using SYLVANIA™ fluroescent lamps, which had 90 percent of their emission between 300 and 400 nm with a maximum at 351 nm. The exposure time was 4 minutes to an average intensity of 2 mW/cm$^2$ to give a total dose of 480 mJ/cm$^2$. The values reported for dosage were measured according to National Institute for Standards and Testing (NIST) methods. The intensity was measured as described above. A final adhesive film thickness of about 0.0015 inches (38.1 micrometers) was obtained.

Test Methods for Heat-Curable Adhesive Films
Degree of Epoxide Cure (By Differential Scanning Calorimetry)

The heat of reaction before and after exposure to various temperatures for various times was measured using a single cell differential scanning calorimeter (DSC) (Model 220C, Seiko Instruments USA, Inc., Torrance, Calif.). About 3 to 10 milligrams of the adhesive bonding film was placed in a DSC sample pan and hermetically sealed. This was immersed in a hot oil bath equilibrated at a selected temperature for a specified time using a polyamide tweezers, removed and quench-cooled by dipping into a dry ice/isopropanol bath (about −78° C.) for about 5 seconds, then dipped briefly into dichloromethane, followed by briefly dipping into heptane, and finally dabbed dry with a paper towel. The sample was then scanned under a nitrogen purge from 0 to 210° C. at a rate of 15° C./minute. The heat of reaction was calculated as the area under the curve for the exothermic portion of the curve, and was measured using the software provided with the DSC system. The degree of polyepoxide cure was taken as the ratio of the residual heat of reaction for a sample exposed to the oil bath over the residual heat of reaction for a sample not exposed to the oil bath. Reported values are rounded to the nearest whole number and are expressed as a percentage. If the initially prepared samples were not immediately exposed to the oil bath, they were stored in a freezer at 0° C. or less for later evaluation.

Shelf Life

A sample of an adhesive film coated on a release liner as described for Example 30 below, was stored in a rolled form, unprotected from ambient light, at a temperature of 23+/−2° C. and a relative humidity of between about 40 and 70 percent for a period of 16 months. At various times during this period the tack, elasticity, and cure exotherm characteristics were evaluated. In addition, after 16 months a sample of the film was used to prepare a test circuit which was evaluated for electrical resistance characteristics.

Specifically, retention of tack was measured by touching a finger to the surface of the film to determine if it still retained a "sticky" feeling. If a "sticky" feeling was observed a rating of "+" was assigned, and if not a rating of "−" was assigned. Elasticity was determined by removing the liners from a sample of the adhesive film, grasping it between thumb and forefinger at each end and gradually stretching it to about 100 percent of its original dimension. If the adhesive film did not break, it was rated "acceptable", and if it broke, it was rated "unacceptable." Residual cure exotherm was measured as described above in Method 1 of "Degree of Epoxide Cure." The exotherm value obtained was divided by the initial, unaged value to get a "% Exotherm Remaining" number. After 16 months, the adhesive film was used to prepare a test circuit as described below in "Electrical Resistance—Method 1." The test circuits with the adhesive film was cured at 140° C. for 30 seconds at 200 psi and evaluated for electrical resistance both initially and after environmental aging. The environmental aging parameters used correspond to Condition 1 of "Electrical Resistance—Method 1" below.

Electrical Resistance

Method 1

The electrical resistance between two test circuits bonded together with the conductive adhesive bonding films prepared as described above in "General Preparation Heat-Curable of Adhesive Bonding Films—Method 1" was measured both before and after environmental aging.

More specifically, sample strips measuring approximately 3 inches (7.62 cm) in length by 0.25 inches (0.64 cm) in width were cut out of the coated, irradiated adhesive sandwich construction, the release liner from one side was removed, and the exposed adhesive surface placed across the test circuit pattern at one end of a 0.005 inches (0.127 mm) thick flexible polyester circuit sample, 1.81 inches (46 mm) in length by 1.57 inches (40 mm) in width (Lakeside Nameplate Co., Minneapolis, Minn.). The test circuit contained 8 lines of silver ink conductor, in a 4 point probe pattern, with a line width of 0.025 inches (0.64 mm) and a center to center line spacing of 0.10 inches (2.5 mm). Light pressure was applied by hand to the surface of the second release liner still on the adhesive film to bond the film to the flexible substrate with sufficient strength to permit handling. The second release liner was then removed, and the circuit lines on the flexible substrate were visually aligned with matching circuit lines of 1 ounce (35 micron) copper plated with solder on a 0.040 inches (0.10 cm) thick rigid substrate of FR-4 type composite (glass reinforced epoxy resin; More Than Circuits, Inc., St. Paul, Minn.) After applying light pressure by hand to this assembly, the bond strength of the adhesive was sufficient to permit handling without delamination.

The bonding film was cured under a uniform pressure of 200 psi (1.37 MegaPascals) and heat using a hot bar thermode bonder (Model RSM 4000, Toddco General, Inc., San Diego, Calif.), equipped with a ceramic thermode having a footprint of 1.97 by 0.118 inches (50 by 3 mm), for various times and temperatures. A silicone rubber strip (SARCON™ 45T, Fujipoly America, Cranford, N.J.) was positioned between the test assembly and the thermode. Cure time was measured once the test assembly reached the desired temperature based on a calibration curve.

Calibration was carried out by placing a metal foil thermocouple (Model C-02-K, Omega Engineering, Stamford, Conn.) between the flexible circuit and the FR-4 substrate in place of the adhesive film and plotting the actual temperature versus the time it took to reach the setpoint temperature. The final temperature exhibited a fluctuation of +/−5° C. from the setpoint during the cure cycle. Upon completion of the cure cycle, heat and pressure were removed by lifting the thermode bar and silicone rubber strip and the samples were removed from the stage and allowed to cool.

After cooling for between 3 to 24 hours at room temperature the bonded samples were evaluated for their initial electrical resistance. Measurements were made at a temperature of about 72° F. (22° C.) and a relative humidity (R.H.) between about 40 and 70 percent on the eight bonded interconnects of each sample using a Keithley Source-Measure Unit (Model 236; Keithley Instruments, Cleveland, Ohio), a Keithley Scanner (Model 705), and LABVIEW™ data acquistion software (vol. 3.1, National Instruments, Austin, Tex.). A source voltage of 20 mV was used and the resistance was calculated by dividing the applied voltage by the measured current. Duplicate samples were evaluated, and the combined resistance range of the sixteen total interconnected traces were recorded.

Samples were then placed into an environmental chamber (identified below) and exposed to one of three different protocols.
Condition 1: 77° C./90 % R.H. (Despatch Model EC 503 environmental chamber, Despatch Industries, Minneapolis, Minn.)
Condition 2: Hold at −20° C. for 45 minutes, ramp up to 70° C. over a period of 45 minutes, hold at 70° C./90% R.H. for 45 minutes, ramp down to −20° C. over 45 minutes. Total cycle time =3 hours. Repeat continuously. (Despatch Model EC 603 environmental chamber)
Condition 3: 85° C./85% R.H. (Despatch Model LEAL 69 environmental chamber)
Electrical resistance measurements were made at 7 and/or 14 days and the results obtained were compared to the initial resistance values to evaluate electrical interconnect stability, for example, opens and changes in resistance.

Method 2

The electrical resistance between two test circuits bonded together with the conductive adhesive bonding films prepared as described above in "General Preparation of Heat-Curable Adhesive Bonding Films—Method 2" was measured both before and after environmental aging.

Specifically, a rigid FR-4 substrate (TRC Circuits, Crystal, Minn.) was preheated for 10 seconds on a hot plate set at about 45° C. The FR-4 substrate had a thickness of 0.060 inches (0.15 cm) and a test circuit pattern thereon comprised 0.002 inches (50.8 micrometers) thick gold plated copper traces which were 0.008 inches (0.20 mm) wide and had a center to center spacing of 0.008 inches (0.20 mm). Sample strips measuring about 1.0 inches (2.5 cm) in length by about 0.12 inches (0.3 cm) in width were cut out of the coated, irradiated adhesive sandwich construction, the release liner from one side was removed and the exposed adhesive surface placed across one end of the test pattern circuit lines on the rigid substrate. A wooden Q-TIP™ was pressed, using light hand pressure, along the length of the second release liner still on the adhesive film to bond the film to the warmed rigid FR-4 substrate. After about 10 seconds, the second release liner was then removed.

Next, a flexible circuit (3M™ Brand Heat Seal Connector without adhesive, available from Minnesota Mining and Manufacturing Company, St Paul, Minn.) comprised of a 0.001 inch (0.025 mm) thick polyethylene terephthalate (PET) film substrate, measuring 1 inch (2.54 cm) by a width of 0.25 inches (0.64 cm) and having on one surface a test pattern, was bonded to the exposed surface of the adhesive bonding film. The test pattern on the flexible circuit had 0.0012 inch (3 micrometer) thick copper traces which were 0.008 inches (0.20 mm) wide and had a center to center spacing of 0.008 inches (0.20 mm). The circuitry on the flexible substrate was in contact with the adhesive film and aligned with the circuit pattern on the rigid FR-4 substrate. The circuit lines on the flexible substrate were all connected by a buss bar which ran perpendicular to the circuit lines and was located at the end opposite the interconnection between the rigid and flexible substrates.

The bonding film was cured under a uniform pressure of 28 psi (0.19 MegaPascals) and heat for 35 seconds using a 1093 Series Hot Stamp Bonder (DCI, Inc., Olanthe, Kans.) equipped with a metal thermode having a footprint of 1×0.118 inches (25.4×2 mm), for various times and temperatures. A silicone rubber strip (Product No. SRG 0607, Minnesota Mining and Manufacturing Company, St. Paul, Minn.) was positioned between the test assembly and the thermode. Temperature calibration, cure time, sample cooling, and testing were conducted as described above in Method 1 of "Electrical Resistance", except the number of circuit lines evaluated on each sample was 15 giving a combined total of 30.

Samples were then placed into an environmental chamber (identified below) and exposed to one of two different protocols.
Condition 4: Hold at 40° C. for 60 minutes, ramp up to 85° C. over a period of 30 minutes, hold at 85° C. for 60 minutes, ramp down to −40° C. over 30 minutes. Total cycle time =3 hours. Repeat continuously. (Despatch Model 16307 environmental chamber)
Condition 5: 60° C./95% R.H. (Despatch Model LEAL 69 environmental chamber)

Electrical resistance was evalated, using a 4 wire measurement method, made after specified times and the results obtained were compared to the initial resistance values to determine electrical interconnect stability.

GLOSSARY

| | |
|---|---|
| AGEFLEX ™ IBOA | Isobornyl acrylate (CPS Chemical Co., Old Bridge, NJ) |
| AGEFLBX ™ PEA | Phenoxyethyl acrylate (CPS Chemical Co., Old Bridge, NJ) |
| ANCAMINE ™ 2337S | Modified aliphatic amine (Air Products and Chemicals, Inc., Pacific Anchor Chemical, Allentown, PA) |
| Au/Ni | Nickel spheres coated with 4% gold, nominal particle size = 10–20 micrometers (custom ordered) (Novamet, Inc., Wykoff, NJ) |
| BOSTICK ™ 7900 | Amorphous, linear saturated copolyester (Bostik, Middleton, MA) |
| CAB-O-SIL ™ M5 | Fumed silica (Cabot Corporation, Tuscola, IL) |
| CGI 1700 ™ | Liquid free radical photoinitiator blend of bis(2,6-dimethoxybenzoyl)-2,4,4-trimethylpentylphosphine oxide and 2-hydroxy-2-methyl-1-phenyl-2-propanone (CIBA-GEIGY, Tarrytown, NY) |
| CN 104 ™ | Liquid bisphenol A diacrylate oligomer (Sartomer Company, Exton, PA) |
| CONDUCT-O-FIL ™ S-3000-S-3M | Silver coated solid glass spheres, particle size = 43 +/− 4 micrometers, range = 20–60 micrometers (80%) (Potters Industries Inc., Parsippany, NJ) |
| CONDUCT-O-FIL ™ S-3000-S-3MM | Silver coated solid glass spheres, particle size = 34 +/− 4 micrometers, range = 20–50 micrometers (80%) (Potters Industries Inc., Parsippany, NJ) |
| EBECRYL ™ 230 | Low viscosity aliphatic urethane diacrylate oligomer, MW = 5000 (UCB Radcure Inc., Smyrna, GA) |
| EBECRYL ™ 3605 | Partially acrylated bisphenol A epoxy resin, MW = 450 (UCB Radcure Inc., Smyrna, GA) |
| EBECRYL ™ 8804 | Crystalline semi-solid aliphatic urethane diacrylate oligomer, MW = 1400 (UCB Radcure Inc., Smyrna, GA) |

-continued

GLOSSARY

| | |
|---|---|
| EPON ™ 164 | Solid multifunctional novolac epoxy resin, epoxy equivalent weight 200–240 (Shell Chemical Co., Houston, TX) |
| EPON ™ 825 | Liquid bisphenol A epoxy resin, epoxy equivalent weight = 172–178 (Shell Chemical Co., Houston, TX) |
| EPON ™ 828 | Liquid bisphenol A epoxy resin, epoxy equivalent weight = 185–192 (Shell Chemical Co., Houston, TX) |
| PARALOID ™ BXL-2691 A | Methacrylate-butadiene-styrene core/shell particle (Rohm and Haas Co., Philadelphia, PA) |
| G6720 ™ | (3-glycidoxypropyl)trimethyoxysilane (United Chemical Technologies, Inc., Bristol, PA) |
| LUCIRIN ™ TPO | 2,4,6-trimethylbenzoyldiphenylphosphine oxide free radical photoinitiator (BASF Corporation, Charlotte, NC) |
| PKHP ™ 200 | Phenoxy resin, molecular weight (weight average) = 50,000–60,000, average particle size: about 200 micrometers (Phenoxy Associates, Rock Hill, SC) |

In the examples described below all amounts are given in grams unless noted otherwise.

EXAMPLES 27–29

Examples 27–29 having the compositions shown in Table 5 were prepared as described above in Method 1 of "General Preparation of Heat-Curable Adhesive Compositions." For Example 27, core-shell type particles were blended, one spatula-size portion at a time, into the solution using the above-mentioned disk impeller. This step took place after allowing the solution to cool to room temperature following the addition of the thermoplastic. An opaque dispersion resulted.

TABLE 5

| Example | Polyepoxide[1] | Phenoxyethyl Acrylate[2] | Urethane Diacrylate[3] | Urethane Diacrylate[4] | Phenoxy Resin[5] | Copolyester[6] | Photoinitiator[7] | Amine Curing Agent[8] | Core-Shell Polymer[9] | Conductive Material[10] |
|---|---|---|---|---|---|---|---|---|---|---|
| 27 | 41.1 | 24.6 | 2.7 | -0- | 5.1 | -0- | 0.08 | 16.4 | -0- | 10 |
| 28 | 34.4 | 33.7 | -0- | 0.7 | -0- | 6.0 | 0.1 | 17.2 | -0- | 8 |
| 29 | 32.2 | 31.6 | -0- | 0.6 | 3.8 | -0- | 0.1 | 16.1 | 7.6 | 8 |

Note:
Example 27 employed CONDUCT-O-FIL ™ S-300-3M; Examples 28 and 29 employed CONDUCT-O-FIL ™ S-3000-3MM.
[1]EPON ™ 828
[2]AGEFLEX ™ PEA
[3]EBECRYL ™ 230
[4]EBECRYL ™ 8804
[5]PKHP ™-200
[6]BOSTIK ™ 7900
[7]LUCIRIN ™ TPO
[8]ANCAMINE ™ 2337S
[9]PARALOID ™ EXL 2691A
[10]CONDUCT-O-FIL ™ S-3000-3M, S-3000-3MM

EXAMPLES 30–35

The composition of Example 27 was converted to a tacky adhesive bonding film as described above in "General Preparation of Heat-Curable Adhesive Bonding Films—Method 1" with the following exceptions. A 9 inch (15.2 cm) wide knife-over-bed coating station having dams positioned to provide a 6 inch wide coating area was used; polyethylene clad paper having a thickness of 0.0035 inches (88.9 micrometers) was employed as the single release liner; irradiation was carried out in a nitrogen purged atmosphere using SYLVANIA™ flouroescent lamps, which had 90 percent of their emission between 300 and 400 nm with a maximum at 351 nm; an average intensity of 4 mW/cm$^2$ was maintained for 5 minutes to give a total dose of 1392 mJ/cm$^2$.

This adhesive bonding film was used to evaluate the effect of various time/temperature cure cycles on the degree of cure as measured using the method described above in "Degree of Cure (by Differential Scanning Calorimetry)."

liners as described above in "General Preparation of Heat-Curable Adhesive Bonding Films—Method 1", with modifications made for Example 27 as noted above in Examples 30–35. These adhesive bonding films were used to prepare electrical interconnect test samples which were cured at various times/temperatures and then evaluated in terms of electrical resistance characteristics both before and after exposure to environmental conditions as described above in Method 1 of "Electrical Resistance." The cure conditions and resistance values obtained are shown in Table 7.

TABLE 7

ELECTRICAL RESISTANCE STABILITY

| Example | Table 5 Composition | Cure Temperature (° C.) | Cure Time (seconds) | Environmental Aging Condition | Initial Resistance (Range in Ohms) | Resistance After 168 hours (Range in Ohms) | Resistance After 336 hours (Range in Ohms) |
|---|---|---|---|---|---|---|---|
| 36a | 27 | 90 | 60 | 1 | 0.82–1.02 | 0.68–0.92 | 0.77–1.22 |
| 36b | 27 | 90 | 90 | 1 | 0.72–0.89 | 0.62–0.77 | 0.75–0.89 |
| 37a | 27 | 130 | 10 | 1 | 0.94–(OPEN) | 0.70–(OPEN) | 0.74–(OPEN) |
| 37b | 27 | 130 | 20 | 1 | 0.76–1.99 | 0.54–1.43 | 0.60–1.99 |
| 37c | 27 | 130 | 30 | 1 | 0.75–1.46 | 0.71–1.31 | 0.83–1.66 |
| 37d | 27 | 130 | 60 | 1 | 0.56–0.69 | 0.48–0.61 | 0.58–0.73 |
| 38 | 27 | 140 | 30 | 3 | 0.32–0.43 | N.D. | 0.43–0.79 |
| 39a | 28 | 140 | 30 | 1 | 0.56–0.72 | N.D. | 0.62–0.79 |
| 39b | 28 | 140 | 30 | 2 | 0.50–0.69 | N.D. | 0.50–0.67 |
| 40a | 29 | 140 | 30 | 1 | 0.46–0.55 | N.D. | 0.49–0.72 |
| 40b | 29 | 140 | 30 | 2 | 0.45–0.54 | N.D. | 0.44–0.53 |

NOTES:
1) OPEN: >10,000 Ohms resistance
2) N.D. = Not Determined

The results are shown in Table 6.

TABLE 6

DEGREE OF CURE

| Example | Table 5 Composition | Cure Temperature (° C.) | Cure Time (seconds) | Degree of Cure (%) |
|---|---|---|---|---|
| 30a | 27 | 90 | 60 | 44 |
| 30b | 27 | 90 | 90 | 52 |
| 31a | 27 | 120 | 30 | 56 |
| 31b | 27 | 120 | 60 | 74 |
| 31c | 27 | 120 | 90 | 54 |
| 32a | 27 | 130 | 10 | 40 |
| 32b | 27 | 130 | 20 | 55 |
| 32c | 27 | 130 | 30 | 66 |
| 32d | 27 | 130 | 60 | 83 |
| 33a | 27 | 140 | 30 | 90 |
| 33b | 27 | 140 | 60 | 92 |
| 33c | 27 | 140 | 90 | 96 |
| 34a | 27 | 150 | 15 | 84 |
| 34b | 27 | 150 | 130 | 100 |
| 35 | 27 | 160 | 15 | 93 |

The results in Table 6 show that a degree of cure of between 50 and 100 percent can be achieved in a time of between 15 and 130 seconds at a temperature between 90 and 160° C. Examples 30a and 32a were cured under conditions which provided a degree of cure of less than 50 percent.

EXAMPLES 36–40

The compositions of Examples 27–29 were each converted to a tacky adhesive bonding film between two release The results in Table 7 show that an acceptable electrical connection was made in all examples where the cure conditions employed provided greater than a 50 percent degree of polyepoxide cure based on the results shown in Table 6. These connections remained acceptable, that is, the resistance did not drift more than 1 Ohm, even after 336 hours (2 weeks) of exposure to environmental conditioning. Examples 36a and 37a were cured under conditions which provided a degree of cure of less than 50 percent.

EXAMPLE 41

A bonding film made from the composition of Example 27 was aged at ambient conditions for 16 months and evaluated periodically during this time as described above in the test method "Shelf Life" to determine how long the adhesive bonding film retained acceptable handling and polyepoxide cure characteristics in the uncured state, as well as its electrical properties in the cured state. The results are shown in Table 8.

TABLE 8

SHELF LIFE

| Example | Table 5 Composition | Storage Time (Months) | Tack | Elasticity | % Exotherm Remaining | Initial Resistance (Range in Ohms) | Resistance After 336 hours (Range in Ohms) |
|---|---|---|---|---|---|---|---|
| 41a | 27 | 0 | + | + | 100 | N.D. | N.D. |
| 41b | 27 | 5 | + | + | 100 | N.D. | N.D. |
| 41c | 27 | 11 | + | + | 100 | N.D. | N.D. |
| 41d | 27 | 14 | + | + | 100 | N.D. | N.D. |
| 41e[1] | 27 | 16 | + | + | 100 | 0.56–0.90 | 0.56–1.19 |

Note:
N.D. = Not Determined
[1]Environmental Aging Condition #1

The results in Table 8 show that an uncured adhesive bonding film made from the composition of Example 27 retained acceptable handling and polyepoxide cure characteristics for up to 16 months under ambient storage conditions. In addition such a film retained its ability to provide stable electrical interconnections, even after environmental aging, when cured.

EXAMPLES 42 and 43

Examples 42 and 43 having the compositions shown in Table 9 were prepared as described above in Method 2 of "General Preparation of Heat-Curable Adhesive Bonding Films" except that Example 43 did not contain core/shell particles.

EXAMPLES 44–49

The compositions of Examples 42 and 43 were each converted to a nontacky adhesive bonding films between two release liners as described above in Method 2 of "General Preparation of Heat-Curable Adhesive Bonding Films."

These adhesive bonding films were used to evaluate the effect of various time/temperature cure cycles on the degree of cure as measured using the method described above in "Degree of Cure (by Differential Scanning Calorimetry)" with the following modifications. The samples were dipped in acetone instead of heptane; a Model 30 DSC (Mettler Instrument Corporation, Highstown, N.J.) was used to analyze the samples for degree of cure and the temperature range scanned was −30 to 250° C. The results are shown in Tables 10 and 11 respectively.

TABLE 9

| Example | Polyepoxide[1] | Polyepoxide[2] | Acrylate-Epoxy Resin[3] | Epoxyiacrylate[4] | Core-Shell Polymer[5] | Isobornyl Acrylate[6] |
|---|---|---|---|---|---|---|
| 42 | 0.0 | 8.0 | 0.3 | -0- | 2.9 | -0- |
| 43 | 2.0 | 8.0 | 0.0 | 0.2 | 0.0 | 2.0 |

| Example | Phenoxyethyl Acrylate[7] | Coupling Agent[8] | Amine Curing Agent[9] | Photo-initiator[10] | Conductive Particles[11] | Au/Ni Particles |
|---|---|---|---|---|---|---|
| 42 | 12.3 | 0.3 | 2.8 | 0.1 | 0.8 | 4.0 |
| 43 | 8.0 | 0.3 | 3.6 | 0.1 | 0.8 | 4.0 |

Note:
CN 104 added as 25% solution in PEA
[1]EPON ™ 825
[2]EPON ™ 164
[3]EBECRYL ™ 3605
[4]CRAYNOR ™ CN 104
[5]PARALOID ™ EXL 2691A
[6]AGEFLEX ™ IBOA
[7]AGEFLEX ™ PEA
[8]G 6720 ™
[9]ANCAMINE ™ 2337S
[10]CGI 1700™
[11]CAB-O-SIL ™ M5

TABLE 10

DEGREE OF CURE

| Example | Table 9 Composition | Cure Temperature (° C.) | Cure Time (seconds) | Degree of Cure (%) |
|---|---|---|---|---|
| 44a | 42 | 140 | 8 | 10 |
| 44b | 42 | 140 | 18 | 35 |
| 44c | 42 | 140 | 28 | 59 |
| 45a | 42 | 150 | 8 | 19 |
| 45b | 42 | 150 | 18 | 50 |
| 45c | 42 | 150 | 28 | 73 |
| 46a | 42 | 160 | 8 | 21 |
| 46b | 42 | 160 | 18 | 57 |
| 46c | 42 | 160 | 28 | 76 |

TABLE 11

DEGREE OF CURE

| Example | Table 9 Composition | Cure Temperature (° C.) | Cure Time (seconds) | Degree of Cure (%) |
|---|---|---|---|---|
| 47a | 43 | 140 | 8 | 13 |
| 47b | 43 | 140 | 18 | 24 |
| 47c | 43 | 140 | 28 | 54 |
| 48a | 43 | 150 | 8 | 22 |
| 48b | 43 | 150 | 18 | 53 |
| 48c | 43 | 150 | 28 | 58 |
| 49a | 43 | 160 | 8 | 36 |
| 49b | 43 | 160 | 18 | 68 |
| 49c | 43 | 160 | 28 | 76 |

The results in Table 11 show that a degree of polyepoxide cure of between 50 and 76 percent can be achieved in a time of between 18 and 28 seconds at a temperature between 140 and 160° C. Examples 44a, 44b, 45a, 46a, 47a, 47b, 48a, and 49a were cured under conditions which provided a degree of cure of less than 50 percent.

EXAMPLES 50–58

The adhesive bonding films made from the compositions of Examples 42 and 43 were used to prepare electrical interconnect test samples which were cured at various times/temperatures and then evaluated in terms of electrical resistance characteristics both before and after exposure to environmental conditions as described above in Method 2 of "Electrical Resistance." The cure conditions and resistance values obtained are shown in Tables 12 and 13 respectively.

TABLE 12

ELECTRICAL RESISTANCE STABILITY

| Example | Table 9 Composition | Cure Temperature (° C.) | Cure Time (seconds) | Environmental Aging Condition | Initial Resistance (Range in Ohms) | Resistance After 212 Hrs. (Range in Ohms) |
|---|---|---|---|---|---|---|
| 50a | 42 | 140 | 8 | 4 | 0.84–1.89 | 0.93–2.17 |
| 50b | 42 | 140 | 18 | 4 | 0.26–1.07 | 1.03–1.22 |
| 50c | 42 | 140 | 28 | 4 | 0.43–1.13 | 1.02–1.17 |
| 51a | 42 | 150 | 8 | 4 | 1.11–(OPEN) | 1.75–(OPEN) |
| 51b | 42 | 150 | 18 | 4 | 0.00–1.19 | 1.08–1.21 |
| 51c | 42 | 150 | 28 | 4 | 0.15–1.18 | 0.87–1.32 |
| 52a | 42 | 160 | 8 | 4 | 0.93–1.16 | 1.01–16.64 |
| 52b | 42 | 160 | 18 | 4 | 1.00–1.17 | 1.02–1.21 |
| 52c | 42 | 160 | 28 | 4 | 0.92–1.11 | 0.93–1.23 |
| 53a | 42 | 140 | 8 | 5 | 0.26–1.43 | 1.01–25.14 |
| 53b | 42 | 140 | 18 | 5 | 0.33–1.15 | 1.10–(OPEN) |
| 53c | 42 | 140 | 28 | 5 | 0.93–1.04 | 0.96–1.08 |
| 54a | 42 | 150 | 8 | 5 | 0.52–(OPEN) | 1.06–(OPEN) |
| 54b | 42 | 150 | 18 | 5 | 0.32–1.26 | 1.11–2.00 |
| 54c | 42 | 150 | 28 | 5 | 0.63–1.18 | 1.01–1.23 |
| 55a | 42 | 160 | 8 | 5 | 0.98–950 | 1.23–836 |
| 55b | 42 | 160 | 18 | 5 | 0.40–0.99 | 0.93–1.85 |
| 55c | 42 | 160 | 28 | 5 | 0.96–1.12 | 1.01–1.38[3] |

NOTES:
[1]OPEN: >1,000 Ohms resistance
[2]Range given does not include negative readings
[3]One reading out of 30 measurement gave a value of 5.39, believed to be due to substrate distortion.

TABLE 13

ELECTRICAL RESISTANCE STABILITY

| Example | Table 9 Composition | Cure Temperature (° C.) | Cure Time (seconds) | Environmental Aging Condition | Initial Resistance (Range in Ohms) | Resistance After 338 Hrs. (Range in Ohms) | Resistance After 671 Hrs. (Range in Ohms) |
|---|---|---|---|---|---|---|---|
| 56a | 43 | 140 | 8  | 4 | 0.69–1.35 | 1.18–(OPEN) | 1.16–411 |
| 56b | 43 | 140 | 18 | 4 | 0.22–1.04 | 0.94–1.53   | 0.94–1.65 |
| 56c | 43 | 140 | 28 | 4 | 1.06–1.16 | 1.08–1.17   | 1.08–1.17 |
| 57a | 43 | 150 | 8  | 4 | 0.45–1.12 | 1.17–260    | 1.16–38 |
| 57b | 43 | 150 | 18 | 4 | 0.85–1.08 | 1.04–1.47   | 1.04–1.55 |
| 57c | 43 | 150 | 28 | 4 | 1.01–1.08 | 1.03–1.13   | 0.52–1.17 |
| 58a | 43 | 160 | 8  | 4 | 0.53–1.29 | 1.34–(OPEN) | 1.32–(OPEN) |
| 58b | 43 | 160 | 18 | 4 | 0.94–1.17 | 0.94–1.19   | 0.99–1.19 |
| 58c | 43 | 160 | 28 | 4 | 0.57–1.12 | 0.93–1.13   | 0.93–1.13 |

NOTES:
1) OPEN: >1,000 Ohms resistance
2) For the comparative examples: Range given does not include negative readings which are believed to be due to adjacent opens The results in Tables 12 and 13 show that an acceptable electrical connection was made in all examples where the cure conditions employed provided greater than a 50 percent degree of polyepoxide cure based on the results shown in Tables 10 and 11. These connections remained acceptable even after 671 hours (4 weeks) of exposure to environmental conditioning. Examples 50a, 50b, 51a, 52a, 53a, 53b, 54a, 55a, 55a, 55b, and 57a were cured under conditions which provided a degree of cure of less than 50 percent.

It will be apparent to those skilled in the art that various modifications and variations can be made in the method and article of the present invention without departing from the spirit or scope of the invention. Thus, it is intended that the present invention covers the modifications and variations of this invention provided they come within the scope of the appended claims and their equivalents.

What is claimed is:

1. A method of providing an electrical interconnection comprising the steps of:
    a) applying a heat-curable electrically conductive adhesive film to an electrically conductive substrate, said adhesive film comprising an acrylate polymer, a polyepoxide resin, an effective amount of a heat-activatable modified aliphatic amine polyepoxide resin curing agent, said amine curing agent being insoluble in said adhesive film at 20° C., and an effective amount of an electrically conductive material, said acrylate polymer comprising the polymerization reaction product of:
        i) an acrylate monomer; and
        ii) a crosslinking agent having an acrylate moiety, wherein said composition and components (i) and (ii) are substantially solvent free; and
    b) curing said polyepoxide resin in said adhesive film by heating said adhesive film to a temperature of between 90 to 180° C. for from 15 seconds to 5 minutes.

2. The method of claim 1 wherein the polyepoxide resin component of the adhesive film has a degree of cure of at least 50 percent as determined by differential scanning calorimetry.

3. The method of claim 1 further comprising the step of positioning a second substrate on the heat-curable electrically conductive adhesive film prior to curing said polyepoxide resin.

4. The method of claim 3 further comprising the step of applying pressure to the adhesive during heating.

5. The method of claim 1 wherein the polyepoxide resin curing agent is insoluble in the adhesive matrix at a temperature of about 20° C.

6. The method of claim 1 wherein the polyepoxide resin curing agent is a reaction product of a novolac polyepoxide resin and a di-primary aliphatic amine.

7. The method of claim 1 wherein the polyepoxide resin in the adhesive film is cured at a temperature of between 110 and 160° C. for from 15 seconds to up to 3 minutes.

8. The method of claim 1 wherein the polyepoxide resin in the adhesive film is cured at a temperature of between 120 and 150° C. for from 15 seconds to 90 seconds.

9. The method of claim 1 wherein the heat-curable electrically conductive adhesive film further comprises a thermoplastic polymer or a core-shell impact modifier.

10. The method of claim 1 further comprising the step of applying pressure to the adhesive film during heating.

11. The method of claim 1 wherein the polyepoxide resin:acrylate monomer weight ratio is from 30:70 to 70:30, the crosslinking agent: acrylate monomer weight ratio is from 20:80 to 0.1:99.9, the polyepoxide resin curing agent-:polyepoxide resin weight ratio is from 30:100 to 60:100 and the electrically conductive material is present in an amount of from 1 to 80 percent by volume of the adhesive composition.

12. The method of claim 1 wherein the electrically conductive material is present in an amount of from 1 to 20 percent by volume of the adhesive composition.

13. The method of claim 1 wherein the polyepoxide resin is selected from the group consisting of novolac polyepoxide resins, diglycidyl ethers of bisphenol A, and mixtures thereof.

14. The method of claim 1 wherein the acrylate monomer is phenoxyethylacrylate, isobornyl acrylate, or a mixture thereof.

15. The method of claim 1 wherein the crosslinking agent is selected from the group consisting of urethane diacrylate oligomers and epoxy diacrylate oligomers.

16. The method of claim 1 wherein the adhesive film further comprises a thermally conductive material.

17. A method of providing a medium for heat transfer comprising the steps of:
    a) applying a heat-curable thermally conductive adhesive film to a substrate, said adhesive film comprising an acrylate polymer, a polyepoxide resin, an effective amount of a modified aliphatic amine polyepoxide resin curing agent, said amine curing agent being insoluble in said adhesive film at 20° C., and an effective amount of a thermally conductive material, said acrylate polymer comprising the polymerization reaction product of:

i) an acrylate monomer, and ii) a crosslinking agent having an acrylate moiety, wherein said composition and components (i) and (ii) are substantially solvent free; and b) curing said polyepoxide resin in said adhesive film by heating said adhesive film to a temperature of between 90 to 180° C. for from 15 seconds to 5 minutes.

18. The method of claim 17 wherein the polyepoxide resin component of the adhesive film has a degree of cure of at least 50 percent as determined by differential scanning calorimetry.

19. The method of claim 17 further comprising the step of positioning a second substrate on the heat-curable thermally conductive adhesive film prior to curing said polyepoxide resin.

20. The method of claim 17 wherein the polyepoxide resin curing agent is insoluble in the adhesive matrix at a temperature of about 20° C.

21. The method of claim 17 wherein the polyepoxide resin curing agent is a reaction product of a novolac polyepoxide resin and a di-primary aliphatic amine.

22. The method of claim 17 wherein the polyepoxide resin in the adhesive film is cured at a temperature of between 110 and 160° C. for from 15 seconds to up to 3 minutes.

23. The method of claim 17 wherein the polyepoxide resin in the adhesive film is cured at a temperature of between 120 and 150° C. for from 15 seconds to 90 seconds.

24. The method of claim 17 wherein the heat-curable thermally conductive adhesive film further comprises a thermoplastic polymer or a core-shell impact modifier.

25. The method of claim 17 further comprising the step of applying sufficient pressure to the adhesive film during heating.

26. The method of claim 17 wherein the polyepoxide resin:acrylate monomer weight ratio is from 30:70 to 70:30, the crosslinking agent: acrylate monomer weight ratio is from 20:80 to 0.1:99.9, the polyepoxide resin curing agent: polyepoxide resin weight ratio is from 30:100 to 60:100, and the thermally conductive material is present in an amount of from 5 to 80 percent by volume of the adhesive composition.

27. The method of claim 17 wherein the polyepoxide resin is selected from the group consisting of novolac polyepoxide resins, diglycidyl ethers of bisphenol A, and mixtures thereof.

28. The method of claim 17 wherein the acrylate monomer is phenoxyethylacrylate, isobornyl acrylate, or a mixture thereof.

29. The method of claim 17 wherein the crosslinking agent is selected from the group consisting of urethane diacrylate oligomers and epoxy diacrylate oligomers.

30. An electrically conductive adhesive transfer tape comprising:

(a) a substrate; and attached thereto, (b) a heat-curable adhesive film comprising an acrylate polymer, a polyepoxide resin, an effective amount of a heat-activatable modified aliphatic amine polyepoxide resin curing agent, said amine curing agent being insoluble in said adhesive film at 20° C., and an effective amount of an electrically conductive material, said acrylate polymer comprising the polymerization reaction product of:

i) an acrylate monomer; and ii) a crosslinking agent having an acrylate moiety, wherein said composition and components (i) and (ii) are substantially solvent free, said polyepoxide resin in said adhesive film being curable by heating said adhesive film to a temperature of between 90 to 180° C. for from 15 seconds to 5 minutes.

31. A thermally conductive adhesive transfer tape comprising:

(a) a substrate; and attached thereto, (b) a heat-curable adhesive film comprising an acrylate polymer, a polyepoxide resin, an effective amount of a modified aliphatic amine polyepoxide resin curing agent, said amine curing agent being insoluble in said adhesive film at 20° C., and an effective amount of a thermally conductive material, said acrylate polymer comprising the polymerization reaction product of:

(i) an acrylate monomer; and (ii) a crosslinking agent having an acrylate moiety, wherein said composition and components (i) and (ii) are substantially solvent free, said polyepoxide resin in said adhesive film being curable by heating said adhesive film to a temperature of between 90 and 180° C. from 15 seconds to 5 minutes.

32. A method of providing electromagnetic interference shielding comprising the steps of:

(a) applying a heat-curable electrically conductive adhesive film to a substrate, said adhesive film comprising an acrylate polymer, a polyepoxide resin, an effective amount of a heat-activatable modified aliphatic amine polyepoxide resin curing agent, said amine curing agent being insoluble in said adhesive film at 20° C., and an effective amount of an electrically conductive material, said acrylate polymer comprising the polymerization reaction product of:

i) an acrylate monomer, and ii) a crosslinking agent having an acrylate moiety, wherein said composition and components (i) and (ii) are substantially solvent free; and (b) curing said polyepoxide resin in said adhesive film by heating said adhesive film to a temperature of between 90 to 180° C. for from 15 seconds to 5 minutes.

* * * * *

UNITED STATES PATENT AND TRADEMARK OFFICE
CERTIFICATE OF CORRECTION

PATENT NO. : 6,214,460 B1
DATED : April 10, 2001
INVENTOR(S) : Gregory L. Bluem, Christopher A. Haak, Fred B. McCormick, Jr., Stanley F. Tead It is certified that error appears in the above-identified patent and that said Letters Patent is hereby corrected as shown below:

Title page,
Item [75], the following inventor should be added:
-- Michael A. Kropp, Cottage Grove --

Item [56], 9th reference, "Aumiller etal." should read -- Aumiller et al. --;

Column 1,
Line 10, "Kauss etal." should read -- Kauss et al. --;

Column 2,
Last reference, "WO 97.03143" should read -- WO 97/03143 --;

Column 5,
Line 56, after "150,000" insert -- and --;

Column 7,
Line 12, "pats" should read -- parts --;

Column 14,
Line 45, "component (s)" should read -- component(s) --;

Column 16,
Line 37, before "composition" delete "as";

Column 21,
Line 54, after "Minnesota" insert -- Mining --;

Column 22,
Line 24, "Inc.)" should read -- Inc.). --;

Column 23,
Line 25, after "polymer." begin a new paragraph and then insert -- Rheological test data is shown in Table 3. --;

Column 24,
Line 18, "where)" should read -- Wykoff, N.J.) --;

Column 29,
Line 4, "Minn.)" should read -- Minn.). --;

UNITED STATES PATENT AND TRADEMARK OFFICE
CERTIFICATE OF CORRECTION

PATENT NO. : 6,214,460 B1
DATED : April 10, 2001
INVENTOR(S) : Gregory L. Bluem, Christopher A. Haak, Fred B. McCormick, Jr., Stanley F. Tead It is certified that error appears in the above-identified patent and that said Letters Patent is hereby corrected as shown below:

Column 30,
Line 50, "40°C." should read -- -40°C. --;

Column 31,
Line 9, "AGEFLBX™" should read -- AGEFLEX™ --

Column 32,
Line 11, "BXL-2691 A" should read --EXL-2691 A --;

Column 33,
Line 45, "54" should read -- 84 --;

Column 37,
Line 7, "(C,)" should read -- (C.) --; and

Column 39,
Line 28, delete duplicate entry "55a".

Signed and Sealed this

Twenty-second Day of January, 2002

Attest:

Attesting Officer

JAMES E. ROGAN
Director of the United States Patent and Trademark Office